(12) United States Patent
Hronik

(10) Patent No.: US 7,671,602 B1
(45) Date of Patent: Mar. 2, 2010

(54) METHOD AND APPARATUS FOR CROSS-POINT DETECTION

(75) Inventor: Stanley Hronik, Sunnyvale, CA (US)

(73) Assignee: Integrated Device Technology, Inc., San Jose, CA (US)

( * ) Notice: Subject to any disclaimer, the term of this patent is extended or adjusted under 35 U.S.C. 154(b) by 299 days.

(21) Appl. No.: 11/626,594

(22) Filed: Jan. 24, 2007

(51) Int. Cl.
*G01R 31/08* (2006.01)
*G01R 27/02* (2006.01)
*G01R 13/00* (2006.01)

(52) U.S. Cl. ............... 324/531; 324/609; 702/66
(58) Field of Classification Search ............... 324/531
See application file for complete search history.

(56) References Cited

U.S. PATENT DOCUMENTS

| | | | |
|---|---|---|---|
| 4,808,944 A * | 2/1989 | Taylor ............... 330/253 |
| 4,833,418 A * | 5/1989 | Quintus et al. ............... 330/9 |
| 6,433,627 B1 * | 8/2002 | Ruesch ............... 327/563 |
| 6,785,621 B2 * | 8/2004 | Ebert ............... 702/66 |
| 6,789,224 B2 * | 9/2004 | Miura ............... 324/765 |
| 7,126,366 B2 * | 10/2006 | Ohashi et al. ............... 324/765 |
| 7,152,008 B2 * | 12/2006 | Zumkehr et al. ............... 702/106 |
| 7,209,853 B2 * | 4/2007 | Nagai ............... 702/125 |
| 7,332,926 B2 * | 2/2008 | Ohashi et al. ............... 324/765 |
| 2005/0231227 A1 * | 10/2005 | Ohashi et al. ............... 324/765 |
| 2007/0016835 A1 * | 1/2007 | Hronik et al. ............... 714/727 |
| 2007/0024311 A1 * | 2/2007 | Ohashi et al. ............... 324/765 |

* cited by examiner

*Primary Examiner*—Timothy J Dole
(74) *Attorney, Agent, or Firm*—Heimlich Law; Alan Heimlich, Esq.

(57) ABSTRACT

A method and apparatus for cross-point detection in devices have been disclosed where each leg of a differential signal is compared to a reference voltage and time lags for each are noted in crossing the reference voltage and this information is used to identify characteristics of the differential signal.

6 Claims, 28 Drawing Sheets

METHOD AND APPARATUS FOR CROSS-POINT DETECTION

RELATED APPLICATION

This application is related to application Ser. No. 11/395,602 filed Mar. 31, 2006 titled "Method and Apparatus for Parameter Adjustment, Testing, and Configuration", which is hereby incorporated herein by reference in its entirety including all incorporated references therein.

FIELD OF THE INVENTION

The present invention pertains to devices. More particularly, the present invention relates to a method and apparatus for cross-point detection in devices.

BACKGROUND OF THE INVENTION

Devices, particularly electronic devices, are becoming smaller, faster, and generally more difficult to design and debug at the system level.

One of the signaling techniques used for high speed circuits is that of using differential signals.

To achieve performance levels and immunity from interference, differential signals are commonly used in high-speed interfaces.

Many of the failure causes in a communications link result from a poorly positioned cross-point. Errors can develop in both the signal level (voltage) of the cross-point, or in the relative timing of the cross-point. This may present a problem.

Sensing the cross-point of a high-speed differential signal today requires the use of oscilloscopes and other expensive test equipment. Set up is difficult, since any connection of equipment to a high-speed signal causes alteration of the waveform and potentially complete obscuration of the parameter under measurement. It is frequently impossible to view a critical signal buried deep within a large functioning system. Any time a user must utilize an oscilloscope to monitor a signal; it becomes an expensive, time consuming process. Sometimes the results are marginal. This may present a problem.

BRIEF DESCRIPTION OF THE DRAWINGS

The invention is illustrated by way of example and not limitation in the figures of the accompanying drawings in which.

DETAILED DESCRIPTION

In most situations, the perfect inverse matching of the two signals of the differential pair optimizes the benefits of differential signaling, providing the best signal communication. When waveform distortion and/or mismatched differential signals occur, the potential performance of the communications link is degraded, and link failure may occur. In a differential signal, the cross-point of the two signals is used to identify the change in logic state of the signal and the timing of the transition. Having the ability to monitor the cross-point of a differential signal provides the user with insight into the characteristics of the differential signal, and may help the user identify marginal or failing conditions.

In a differential signal, the position of the cross-point should be optimized for the receiver and occur when both signals of the differential pair are near the middle of their transition. When a cross-point is not optimum, the ability for a system to self monitor the cross-point and report potential problems to the user allows the adjustment of link parameters (such as termination), either manually by the user or in a self-healing mode by the system. Having the cross-point information available allows the user to adjust the system to improve its signal quality, or further isolate communication errors.

Embodiments of the present invention include both an apparatus, and a method, for sensing, and reporting, the differential cross-point of a signal. Instantiations of the invention allow a designation of parametric boundaries, beyond which error conditions are noted and reported. The present invention in one embodiment is embedded in the architecture of the user's design, relieving the user of problems associated with existing methodologies. The present invention may be used in any differential signaling application, including, but not limited to, cable, backplane, on board, on-chip, or other signaling environments, etc.

The present invention in various embodiments may be used as either a part of normal system operation where cross-points are continuously monitored and errors reported, or as part of testing where embodiments of the present invention may be used to debug, calibrate, or validate a system. Observing cross-point levels and cross-point drift provides indication of potential failures and/or degrading conditions in high reliability applications.

While not specifically delineated in FIG. 3, FIG. 4, FIG. 5, FIG. 6, FIG. 7, FIG. 8, FIG. 9, FIG. 10, FIG. 16, FIG. 17, and other figures which illustrate among other things one or more waveforms, it is understood by one of skill in the art that the horizontal axis represents time.

Ideally, the two legs of a differential signal are mirror images of each other around a mid point (reference level). As the differential signal changes logic state, the two legs will continue to mirror each other and cross at the mid point. An example of an idealized differential signal is shown in FIG. 3.

Figure 3:
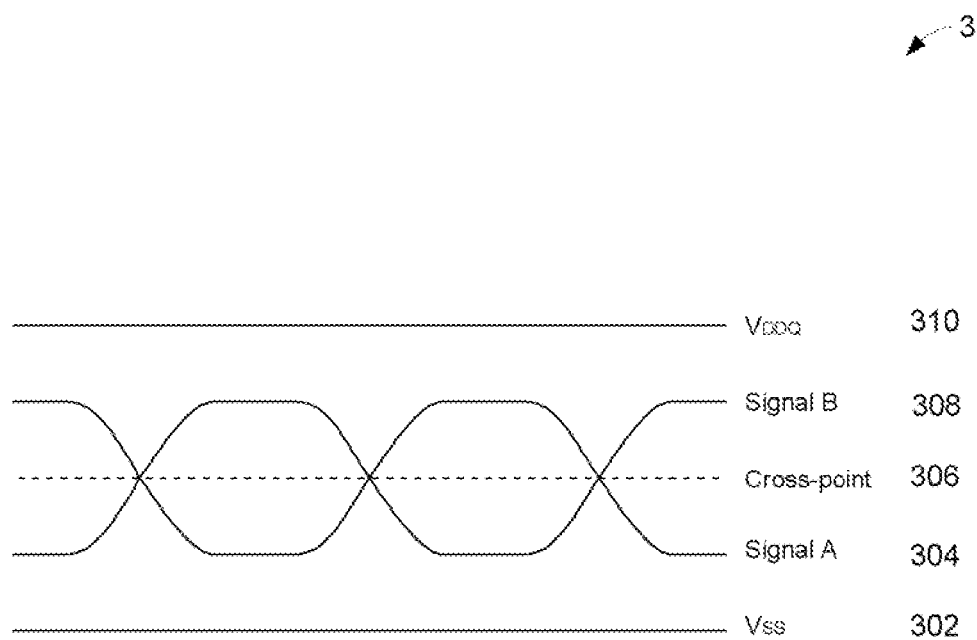
FIG. 3 illustrates an example of an idealized differential signal.

FIG. 3 illustrates, generally at 300, an ideal differential signal cross-point 306 for Signal A 304 and Signal B 308. Also shown are a low voltage Vss 302 and a high voltage Vddq 310.

It should be noted in FIG. 3 that the rise and fall times of the signals match (304, 308) and that the rise/fall times of the signals (304, 308) are clean, meaning there are no distortions in the waveforms that may obscure or cause a shifting of the crossing point (shown here at cross-point 306).

When a differential signal has a waveform that is less than ideal, the cross-point may start to drift from the desired level, and one of the following conditions will develop:

1) All cross-points occur at the same level, but that level may be higher or lower than the desired/optimum level.
2) Cross-points may have an identifiable dependency. For example, logic low transitions may have a cross-point that is separate and distinct from logic high transitions. This means there are two distinct cross-points that are direction dependent.
3) Cross-points are random.

If a cross-point should end up in a position that is not optimum, a multitude of problems can develop in a circuit. An example of a cross-point that is too high is shown in FIG. 4.

Figure 4:
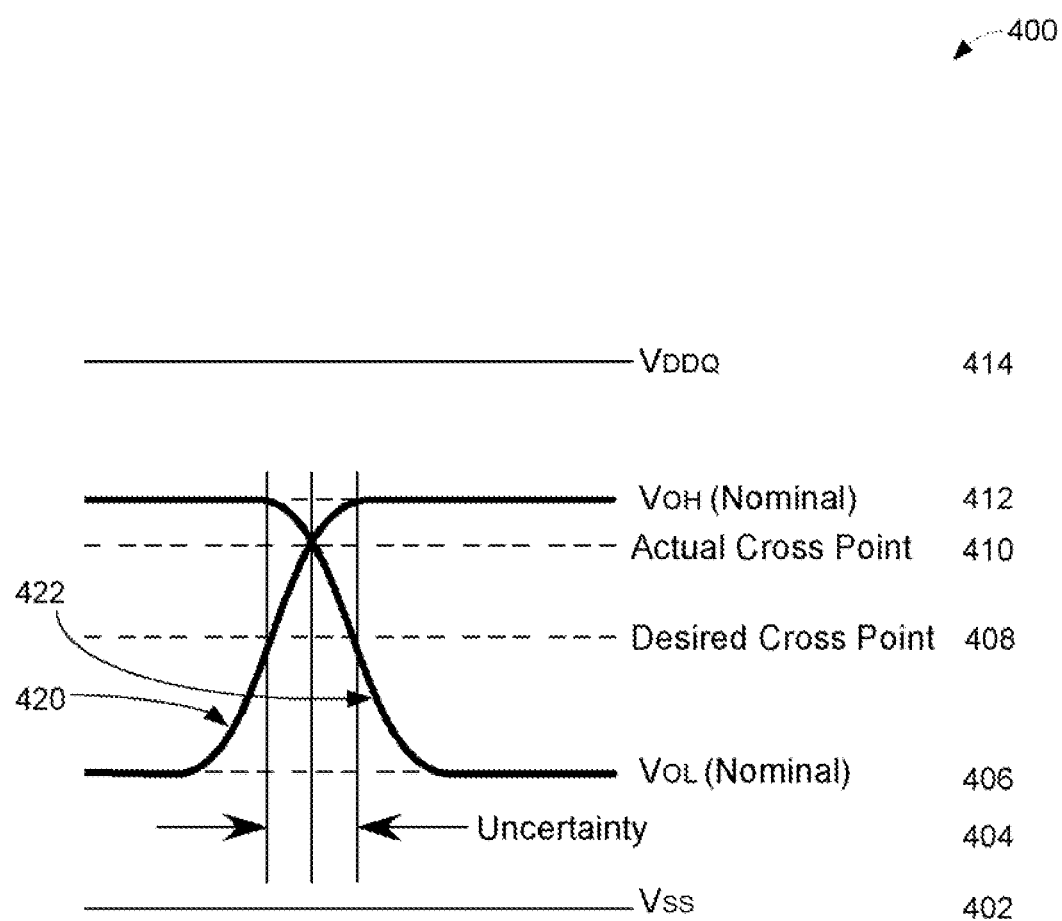
FIG. 4 illustrates a differential pair that is not balanced.

FIG. 4 illustrates, generally at 400, the differential pair (420, 422) is not balanced and the rising edge of one signal (420) arrived slightly before the falling edge of the other signal (422). Also shown in FIG. 4 is a low voltage Vss 402 and a high voltage Vddq 414, a nominal voltage output low (Vol (nominal)) 406, a desired cross point 408, a nominal voltage output high (Voh (nominal)) 412, an uncertainty 404 (region with respect to time), and the actual cross point 410.

Having a cross-point that is higher (such as that illustrated in FIG. 4 at 410) or lower than optimum can create a multitude of problems in high-speed systems. Some of those problems are listed here.

1) Receiver Instability
    Most high-speed differential receivers are optimized to resolve a logic state when the cross-point of the differential signal is near the center between the extremes of the signals as shown in FIG. 3. When a signal such as the one shown in FIG. 4, for example, enters a receiver, the receiver response may be delayed or unstable until the signals are within acceptable limits.
2) Logic Stage Uncertainty
    If a cross-point is outside of the normal working range of a differential amplifier, the receiver may not have the ability to resolve the logic state. Both legs (e.g. levels) of the differential signal may appear simultaneously high or simultaneously low, until one leg of the differential signal can be resolved as having changed state.
3) Jitter
    Inconsistency in the cross-point of a signal affects the receiver timing, the signal transmission characteristics, and may indicate driver inconsistencies.
4) Timing Uncertainty
    If the receiver is not properly functioning due to a high or low cross-point, uncertainty develops in the signal timing as shown in FIG. 4 at 404. This has an effect at several levels:
    a. Individual Signal—Inability of the receiver to identify a signal state causes uncertainty in the positioning of the state change.
    b. Correlating Logic Highs and Lows—If logic highs are crossing at a level inconsistent with logic lows, the timing between the high and low is uncertain.
    c. Bus Timing—If two or more differential signals form a bus, the timing correlation among the signals is uncertain. Relating this bus to a clock may be impossible.
5) EMI (ElectroMagnetic Interference)
    Differential signals that are perfectly balanced emit very little EMI. As distortions develop in the waveforms and they are no longer mirror images, the energy in the signal is not canceled and is radiated.
6) Duty Cycle Distortion
    Duty cycle distortion usually accompanies cross-points that are consistently too high or too low.
7) Loss of Cycle Time
    The net effect of all of these problems is loss of usable cycle time High-speed differential signals are sensitive to their environment. Cross-point errors can develop during the creation, the transmission and the receiving the differential signals. It is beyond the scope of this discussion (nor is it germane to present invention or its understanding) to create an exhaustive list of the possible causes of cross-point errors and the accompanying signal distortion; however, for demonstrative purposes, a few examples will be shown.

Figure 5:
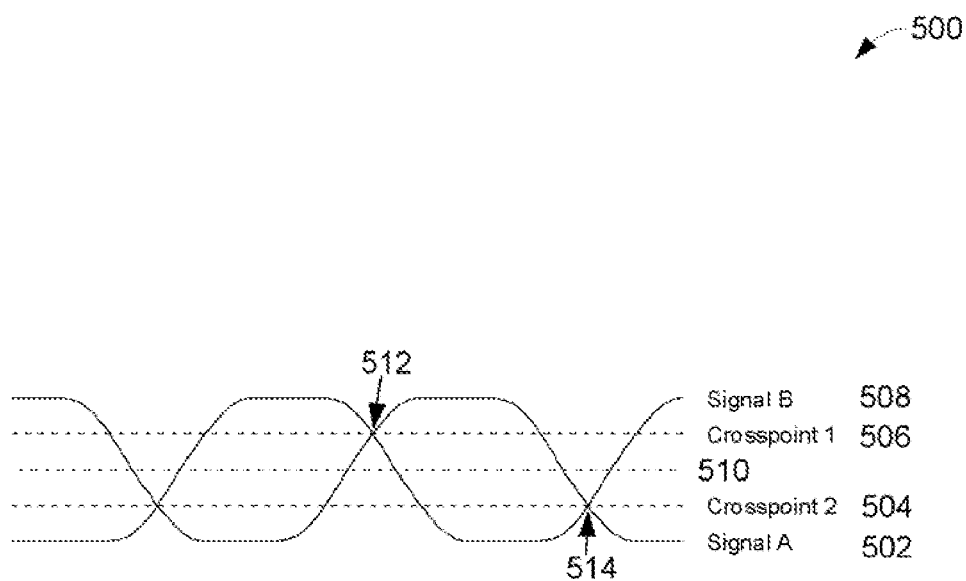
FIG. 5 illustrates a mismatched differential signal due to delay.

One source of cross-point errors is due to mismatched differential signal due to delay. For example, FIG. 5 illustrates, generally at 500, a waveform where Signal A (502) is occurring slightly before Signal B (508) (i.e. signal B (508) is delayed slightly). This condition may be caused by unbalanced routing, termination, driver strength, interference, and many other causes, etc.

It is clear from FIG. 5, that the cross-points (crosspoint 1 (506), and crosspoint 2(504)) are no longer centered between the fully saturated states (as indicated at 510). In addition, the cross-points (506, 504) created from a differential logic HIGH transition (at 512) are dramatically different than the cross-points (506, 504) created from a differential logic LOW transition (514).

A signal such as that shown in FIG. 5 may cause many of the problems mentioned earlier, including the upsetting of the input structure of a receiver.

One source of cross-point errors is an unbalanced signal due to rise/fall (rise and/or fall) times.

Figure 6:
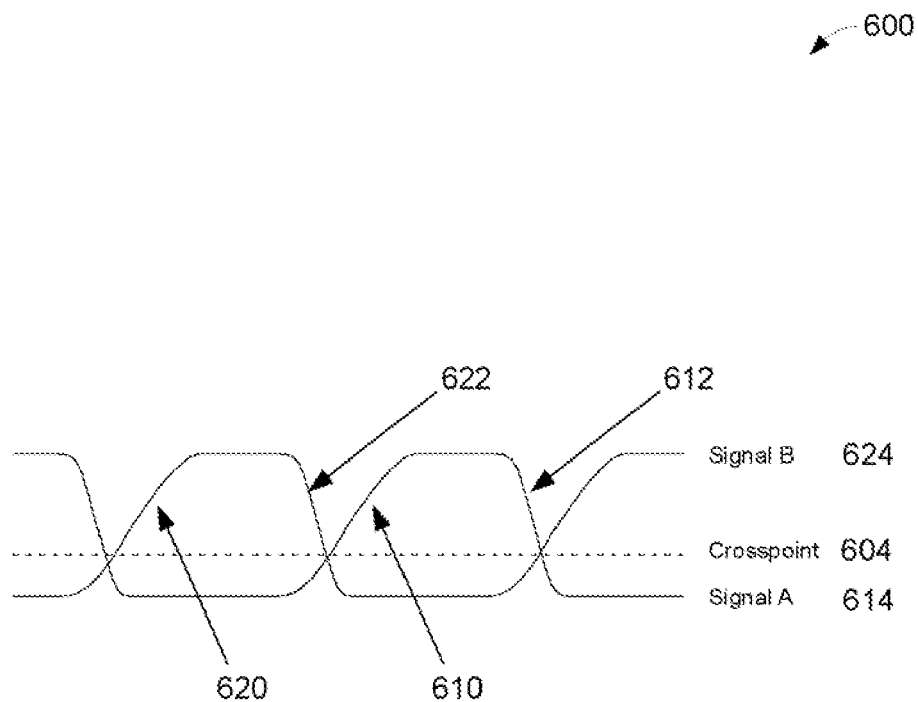
FIG. 6 and FIG. 7 illustrate mismatched differential signals due to differing rise/fall times.

In differential signals, the rise and fall times should match to maintain clean waveforms and effectively toggle a balanced receiver. As an example, FIG. 6 shows, generally at 600, a waveform of a differential signal (Signal A 614, Signal B 624) that has a much faster falling edge (612, 622) than a rising edge (610, 620) on each of its individual signals (614, 624) respectively) of the differential pair. As a result, the falling signals (612 for Signal A 614 and 622 for Signal B 624) arrive much sooner than the rising signal (610 for Signal A 614 and 620 for Signal B 624), causing the cross-point 604 to be low (for example, with respect to the ideal cross-point as illustrated in FIG. 3 at 306). Possible causes of this low cross-point include mismatched driver strength, mismatched termination, mismatched pull up/down driver strength, unbalanced driver strength between the legs of the differential pair, routing issues, etc.

Figure 7:
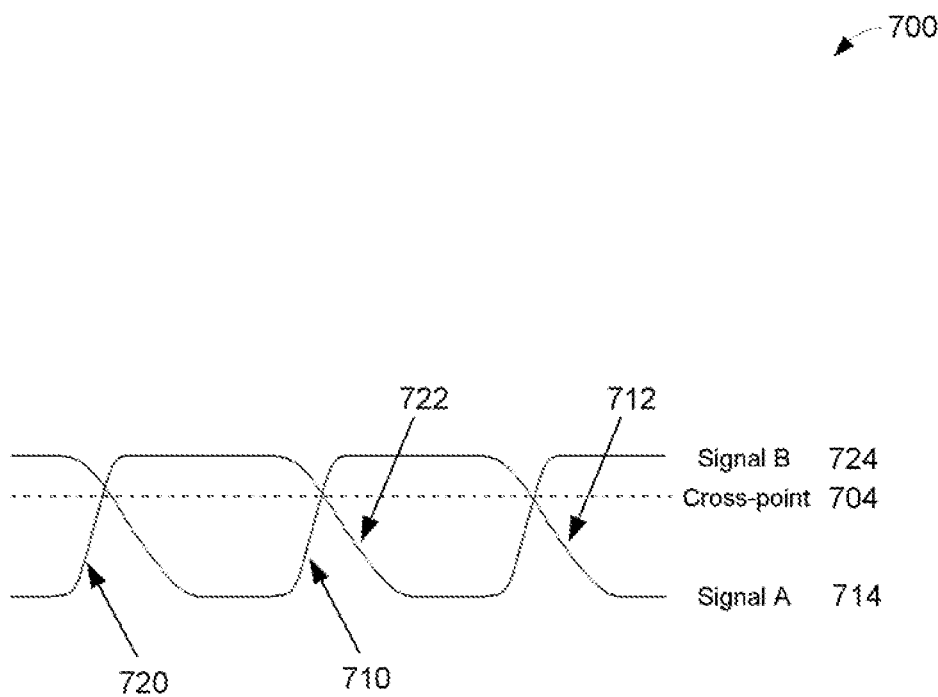

In differential signals, the rise and fall times should match to maintain clean waveforms and effectively toggle a balanced receiver. As an example, FIG. 7 shows, generally at 700, a waveform of a differential signal (Signal A 714, Signal B 724) that has a much faster rising edge (710, 720) than a falling edge (712, 722) on each of its individual signals (714, 724) respectively) of the differential pair. As a result, the rising signals (710 for Signal A 714 and 720 for Signal B 724) arrive much sooner than the falling signal (712 for Signal A 714 and 722 for Signal B 724), causing the cross-point 704 to be high (for example, with respect to the ideal cross-point as illustrated in FIG. 3 at 306). Possible causes of this high cross-point include mismatched driver strength, mismatched termination, mismatched pull up/down driver strength, unbalanced driver strength between the legs of the differential pair, routing issues, etc.

One source of cross-point errors is unbalanced differential amplitude. Unbalanced differential amplitude may be caused by, among other things, unmatched driver strength, mismatched pull up/down driver strength, unbalanced driver strength between the legs of the differential pair, unmatched termination, etc.

Figure 8:
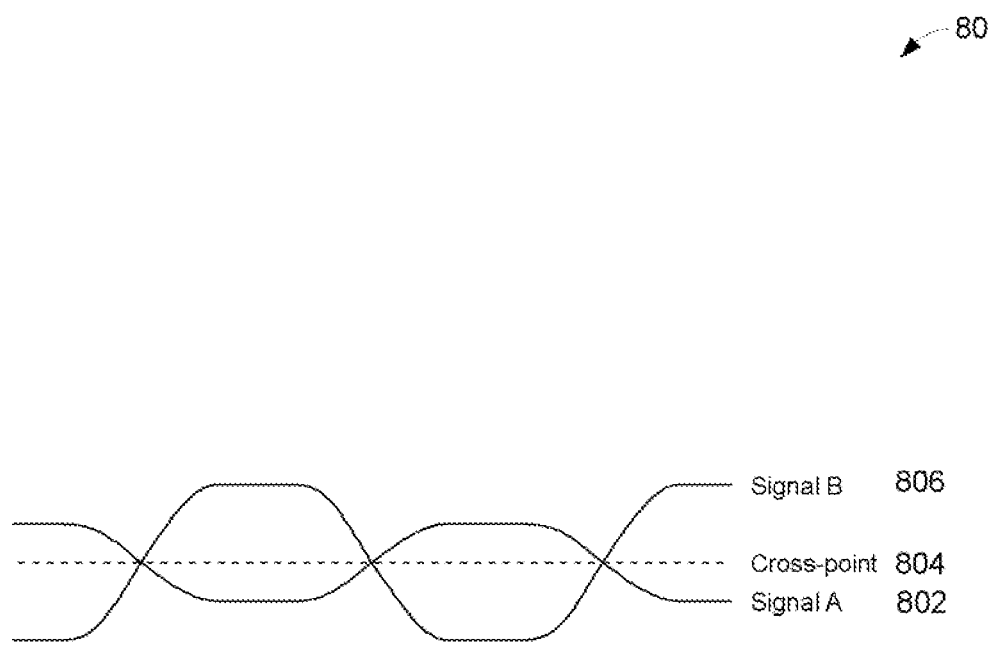
FIG. 8 illustrates an unbalanced differential signal.

FIG. 8 shows, generally at 800, an example of an unbalanced differential signal (Signal A 802, Signal B 806). The cross-point 804 is shown for the unbalanced differential signal (Signal A 802, Signal B 806). Potential causes of this unbalanced differential signal (Signal A 802, Signal B 806) could include unmatched driver strength, mismatched pull up/down driver strength, unbalanced driver strength between the legs of the differential pair, unmatched termination, etc. The cross-point 804 may be centered, high, or low (for example, with respect to the ideal cross-point as illustrated in FIG. 3 at 306).

Some of the possible negative effects of a waveform such as that illustrated in FIG. 8 include the following:

1) EMI caused by an unbalanced signal. The electric fields will not cancel, allowing radiation to escape the circuit.

2) The receiver will not properly sense the timing of the signal. The gain of the receiver is not infinite, therefore slower rising signals will receiver a slower response than a high speed signal. Where Signal A has lower amplitude than Signal B (such as illustrated in FIG. 8), a receiver will be slower to sense the transition of Signal A, causing a timing delay.

In one instance, the cross-point, for example as shown in FIG. 8 at cross-point 804, may be centered, thus, simply sensing the cross-point level will provide no useful information. One instantiation of the invention allows the user to move the sense points and gather additional information. By using hysteresis and the unbalanced nature of the signal, the user has the ability to identify problems with the waveform.

Once source of potential problems for differential receivers are slow transitioning signals.

Figure 9:
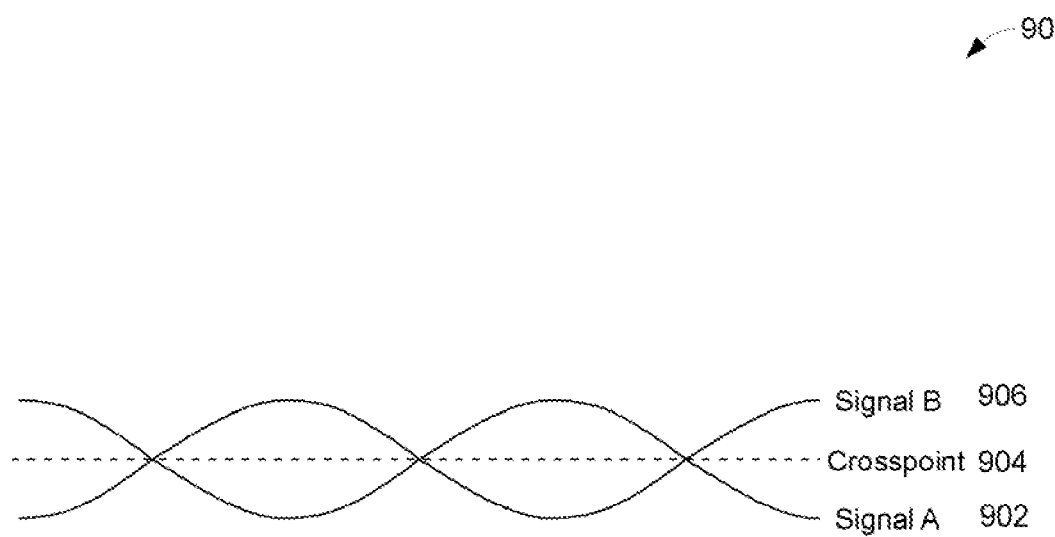
FIG. 9 illustrates a slow transitioning differential signal.

Most differential receivers function optimally when the differential input signal has sharp (i.e. fast) rising and falling edges. As shown in FIG. 9 generally at 900, a slow transitioning signal (Signal A 902, Signal B 906) will hang (i.e. spend more time) near the cross-point (904) longer than a fast rising/falling signal. This longer time near the crosspoint (904) increases the uncertainty of the logic state of a receiver output during the signal transition (of signals 902, 906) and reduces the response time of a receiver.

While the cross-point may be very accurately positioned (for example, as illustrated in FIG. 9 at crosspoint 904, using some of the techniques of the present invention which are described later with hysteresis will help the user to identify the problematic condition of slow transitioning signal(s).

A discussion now follows disclosing techniques of the present invention, as illustrated by various embodiments, for detecting cross-point conditions.

In ideal applications, cross-points would occur at a specified level (please note: not necessarily at a center point). In realistic applications, the cross-points should occur within a window around the ideal level (for example, as illustrated and discussed with respect to FIG. 3). The size of the window may be adjusted to meet the users' needs.

Figure 10:
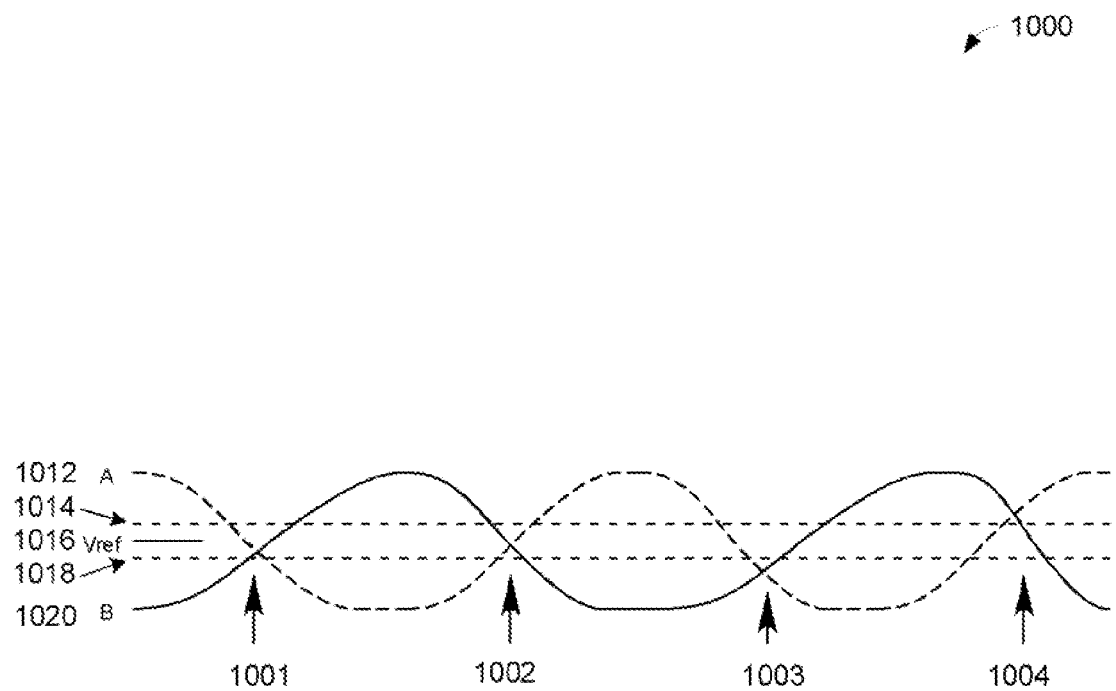
FIG. 10 illustrates one embodiment of the present invention showing a voltage window and an example waveform of a differential signal.

FIG. 10, generally at 1000, is an example waveform showing a differential signal (A 1012, B 1020) that is oscillating around an ideal cross-point level identified as Vref (1016). For the realistic application, a window around Vref (1016) (identified by the parallel dotted lines, 1014, 1018) sets the limits for a valid cross-point. Examining each cross-point individually, the cross-point identified at 1001 is a bit low, but falls within the window. The cross-point at 1002 is also acceptably within the window. The cross-point at 1003 is too low. The cross-point at 1004 is too high. The cross-points at 1003 and 1004 would be reportable as errors.

If we take the waveform of FIG. 10, we can observe a timing relationship between the signals that can be reported in a logic state table as shown in Table 1 below. The notes accompanying the table identify the parameters. To summarize the content of the notes, the parameter "X" is the actual cross-point of the differential signal. "A" is the state of signal A and will change state when it passes Vref, and then also crosses the dotted line beyond Vref (has entered and exited the window). "B" is the state of signal B and it also changes state only after entering and exiting the window identified by the dotted lines.

TABLE 1

State Table

State Diagram to Demonstrate
Differential Crossing Point Problems

| | X | A | B | Event | Note |
|---|---|---|---|---|---|
| Start | H | H | L | Starting condition for a differential HIGH | b |
| #1 | L | H | L | The differential signals cross, creating a differential LOW | c |
| | L | L | L | Signal A crosses Vref and passes out of the hysteresis window around Vref | d |
| | L | L | H | Signal B crosses Vref and passes out of the hysteresis window around Vref | e |
| #2 | H | L | H | The differential signals cross, creating a differential HIGH | f |
| | H | L | L | Signal B crosses Vref and the hysteresis window first this time | |
| | H | H | L | Signal A crosses Vref and passes out of the hysteresis window around Vref | |
| #3 | H† | L | L | Signal A passes through the Vref before Signal B enters the window | g |
| | L† | L | L | The differential signals cross outside the window | h |
| | L | L | H | Signal B crosses Vref and the situation is stable | i |
| #4 | L† | H | H | Signal A crosses Vref and exits the window before X, indicating X is outside the window | j |
| | H† | H | H | X crosses | |
| | H | H | L | Signal B crosses Vref and the situation is stable | |

Notes:

a) "X" indicates the logic state of the differential pair. A change of logic state occurs exactly at the crossing point of the differential signal. "A" indicates the logic state of Signal A plus hysteresis relative to Vref. Due to hysteresis, a change in the logic state of "A" does not occur until "A" has crossed over Vref and exceeded a designated voltage beyond Vref (either higher or lower depending upon the transition direction). "B" indicates the logic state of Signal B plus hysteresis relative to Vref. "A" is the primary signal of the differential pair, and "B" is the inverse.

b) This is the starting condition. "A" is high, "B" is low, and the differential signal is considered logic high. Vref is positioned at the midpoint.

c) This corresponds with transition #1 in the table and, for example, 1001 in FIG. 10. The differential signal is crossing (changing the logic state "X"). The hysteresis on "A" and "B" requires that these signals pass beyond the window shown before their logic states change. i.e. These signals must pass out of the area enclosed by the dotted lines to change logic state.

d) "A" passes out of the window and changes logic state.

e) "B" passes out of the window and changes logic state. All logic changes are complete for the transition and it was a successful transition.

f) Transition #2 completes similarly to transition #1, except the opposite polarity.

g) This corresponds with Transition #3 in the table and, for example, 1003 in FIG. 10. "A" crosses Vref and passes out of the hysteresis window. This is out of sequence and identifies that the differential cross-point is outside the acceptable window.

h) The differential signal cross-point is too low. This can be identified because "A" has already passed beyond the Vref window. Since both "A" and "B" are logic LOW, the correct differential logic state may be undetectable by the differential receiver.

i) The differential signal is established as a logic LOW when "B" enters the Vref window. The transition is complete when "B" departs the Vref window.

j) Transition #4, for example as illustrated at 1004 in FIG. 10, is an indication of both Signal A and Signal B being simultaneously logic HIGH. This may be detected by Signal A passing out of the Vref window prior to the differential signal changing state. The cross point is too high and the differential logic state is uncertain until Signal B drops into the Vref window.

H† and L†—indicates that the logic level may be unstable due to operation outside of parametric boundaries.

Observing FIG. 10, a few techniques of the present invention will be described and identified for isolating a cross-point that occurs outside the designated window (1014, 1018) around Vref (1016). Signal A (1012) is the primary signal of the differential pair, Signal B (1020) is the inverse, the designation of "A" is the logic state of Signal A plus hysteresis, "B" is the logic state of Signal B plus hysteresis. "X" is the logic state of the differential pair with no hysteresis.

Some of the techniques of the present invention for detecting differential cross-point errors include, but are not limited to, the following three techniques:

1) With valid crossing points, a change in "X" occurs before a change in either "A" or "B". If the logic state of "A" or "B" changes state prior to the change in "X", this is an indication that the offending signal is outside the Vref window (1014, 1018) and not capable of a valid crossing. Once "A" and "B" have established opposite logic states, the crossing detection is complete and preparation can be made for the next cycle.

2) Either "A" or "B" makes more than one logic transition without "X" changing logic state. This can be observed in transition 1003 in FIG. 10 where "A" transitions both to a logic high and back to a logic low prior to the differential signal changing logic state. Once the error has occurred, the pattern is no longer valid and an error in the subsequent cycle may not be detected.

3) If a differential crossing occurs when both "A" and "B" are logically at the same state.

As seen from the examples above, differential signal cross-points can have a direct influence on the performance of an interface. By identifying and reporting cross-points or cross-point errors, a system can assist in diagnosing problems. If a system has the ability to make termination or driver adjustments, cross-point detection can be used in a self-calibrating signal environment.

Each application of cross-point sensing may have different needs, so the following examples are illustrations of portions of circuits that may be used individually, or combined with other circuits or portions of circuits to fulfill specific application needs. The following are some of the various capabilities of the present invention as embodied in various embodiments and are not intended to a complete list nor a limitation of the present invention.

1) Sense and report a single cross-point.

2) Sensing all cross-points and reporting only the average.

3) Sensing all cross-points and insuring that they fall within a designated window. Cross-points that fall outside the window (outliers) could be counted and reported as an error count over time, or outliers could be recorded and reported as a value.

4) Separating the Differential logic HIGH cross-points from the logic LOW cross-points and reporting an average for each, or a window violation for each. This would allow the user to isolate the unbalanced conditions described earlier. Especially if the situation shown in FIG. 5 occurs, isolating rising cross-points from falling cross-points may be needed to provide useful information.

Figure 11:
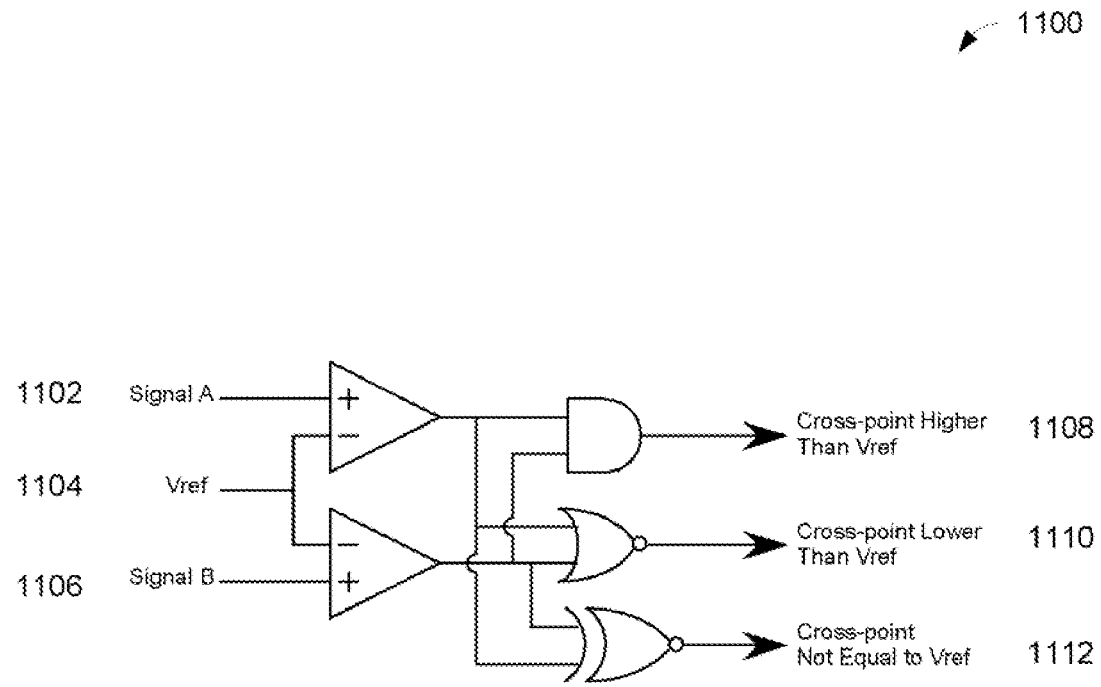
FIG. 11 illustrates one embodiment of the present invention, showing a logical representation of a cross-point detection circuit.

FIG. 11 illustrates, generally at 1100, one embodiment of the present invention, showing a logical representation of a cross-point detection circuit. In the circuit, Signal A (1102) and Signal B (1106) are the two legs of a differential pair. Vref (1104) may be externally provided or generated internally. Vref (1104) should be set to the desired cross-point, allowing the circuit (1100) to sense when the cross-point is above or below Vref (1104).

In the event that the voltage levels on Signal A (1102) and Signal B (1106) are not on opposite sides of Vref (1104) (one higher and one lower), the XNOR gate will indicate an invalid condition, "Cross-point Not Equal to Vref" (1112), and either the AND gate or the NOR gate will indicate (AND gate indicating at 1108, and NOR gate indicating at 1110) in which direction the error is occurring.

As shown in FIG. 11, the output 1112 will toggle to a logic high every time either Signal A (1102) or Signal B (1106) crosses Vref (1104) and both signal A (1102) and signal B (1106) are either high or low, and will remain high until the differential signal resolves itself with Signal A (1102) and Signal B (1106) having opposite polarity above and below Vref (1104). If Vref (1104) is very near (or at) the cross-point of the two signals (1102, 1106) the duration of the output 1112 may be very short. A cross-point that is not near Vref (1104) will generate signals of longer duration. The duration of the outputs 1108, 1110, and 1112 may be used to estimate the difference between Vref (1104) and either signal (1102 or 1106), or the cross-point.

One of skill in the art will appreciate that the outputs 1108, 1110, and 1112 in FIG. 11 will toggle over time and that the transitions of such supply information. For example, the outputs 1108, 1110, and 1112 will toggle only while a condition violation is present (e.g. cross-point higher than Vref, cross-point lower than Vref, cross point not equal to Vref). One of skill in the art will understand that to preserve such transient information, latches, registers, flip-flops, memory, etc. may be used.

Figure 12:
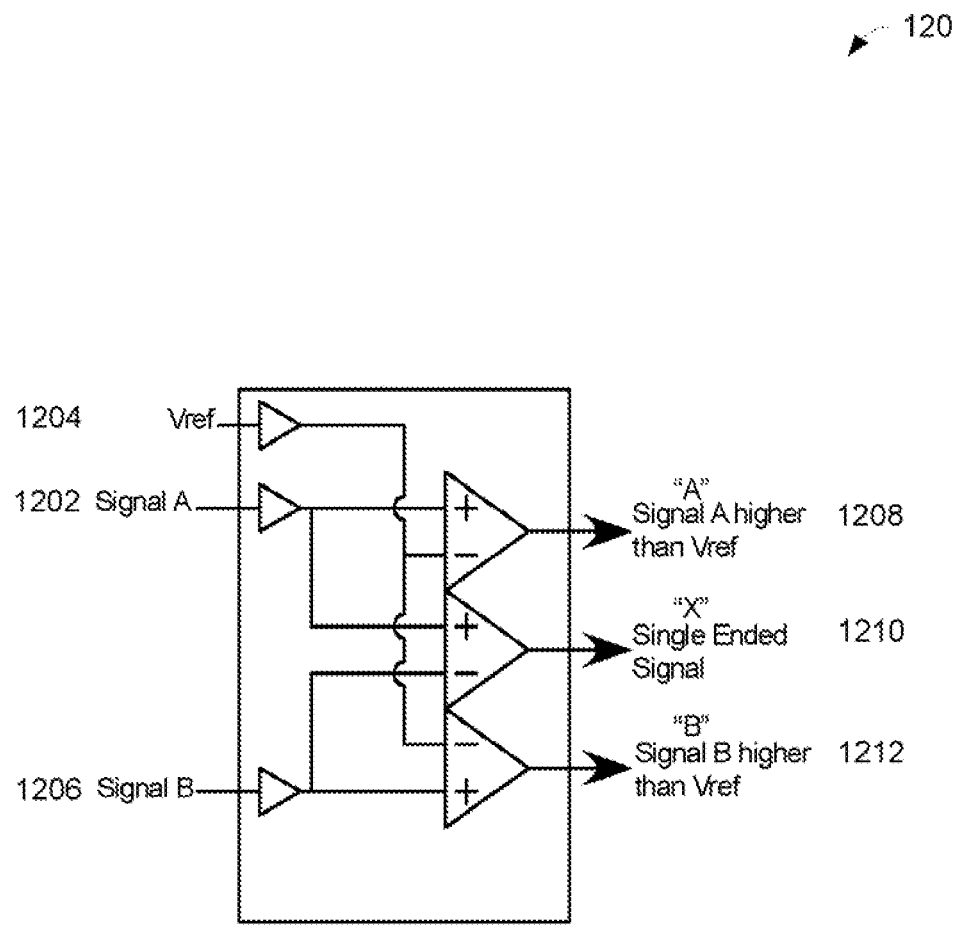
FIG. 12 illustrates one embodiment of the present invention showing an input receiver for cross-point sensing.

FIG. 12 illustrates, generally at 1200, is one embodiment of the present invention showing an input receiver for cross-point sensing. The receiver (1200) accepts the differential pair (Signal A 1202 and Signal B 1206). In the receiver (1200), a comparator compares Signal A (1202) with Vref (1204), and a second comparator compares Signal B (1206) with Vref (1204). Each comparator reports whether the associated signal (A or B) is above or below (1208 A above, 1212 B above) Vref (1204). As one of the signals (A or B) transitions through Vref (1204), the associated comparator will change state. In addition, there is a cross-point indication, designated "X" (1210) that will toggle whenever signal A and signal B cross (assuming the crossing point is at a voltage level that can be resolved by the input receiver. "X" (1210) will indicate the logic state of the differential signal.

In the example described above in FIG. 10, the user is attempting to determine the logic state of the differential pair. In addition, determining whether the cross-point occurs within the window around Vref (indicated by the dotted lines 1014 and 1018 in FIG. 10) will insure the validity of the crossing and the legitimacy of the logic state reported. As described in FIG. 10 and the associated table, Table 1, adding hysteresis to the sensing of the Vref (1016) signal provides the needed window.

Figure 13:
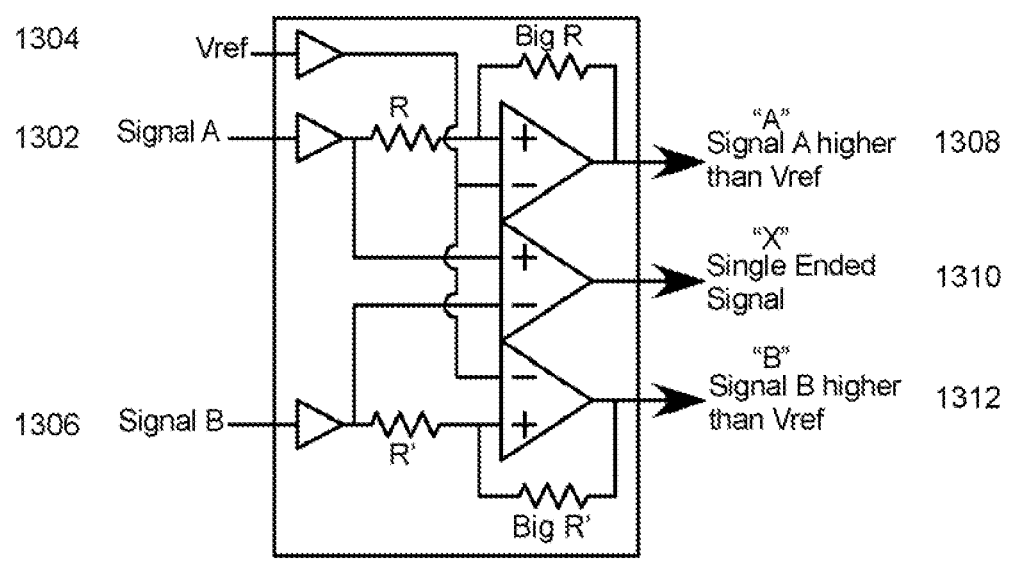
FIG. 13 illustrates one embodiment of the present invention showing a circuit that creates various signals.

FIG. 13, generally at 1300, illustrates one embodiment of the present invention showing a circuit that creates the three signals "X", "A", and "B" (as previously described with respect to FIG. 10 and Table 1). As described, "X" is the differential state and toggles at the crossing. "A" indicates that Signal A is higher than Vref, plus hysteresis. "B" indicates that Signal B is higher than Vref plus hysteresis. FIG. 13 is similar to FIG. 12, however it adds hysteresis to "A" and "B", and not "X".

To create the hysteresis (on the outputs as illustrated in FIG. 13), positive feedback is added to the comparators that sense the Signal A (1302) crossing Vref (1304), and Signal B (1306) crossing Vref (1304). Once a logic state is established on "A" (1308) or "B" (1312), the positive feedback will attempt to maintain the level. Signal A (1302) or Signal B (1306) will need to "fight" the positive feedback in order to force a new state. The ratio of "Big R" to "R" and "Big R'" to "R'" will establish the amount of hysteresis seen on the input (Signal A input and Signal B input). While the value of the ratio may be any value to create any amount of hysteresis, a mainstream value would be in the range of 4 to 1 or 8 to 1. If the ratio is set too small, the input signal may be unable to overdrive the positive feedback.

The previous examples, as was noted above, only provide a very brief indication of whether both signals of the differential pair and presumably cross-point are simultaneously above or below the provided Vref. In one embodiment of the present invention, this information may be integrated to provide a cumulative indication of whether the cross-points on average are above or below Vref.

Figure 14:
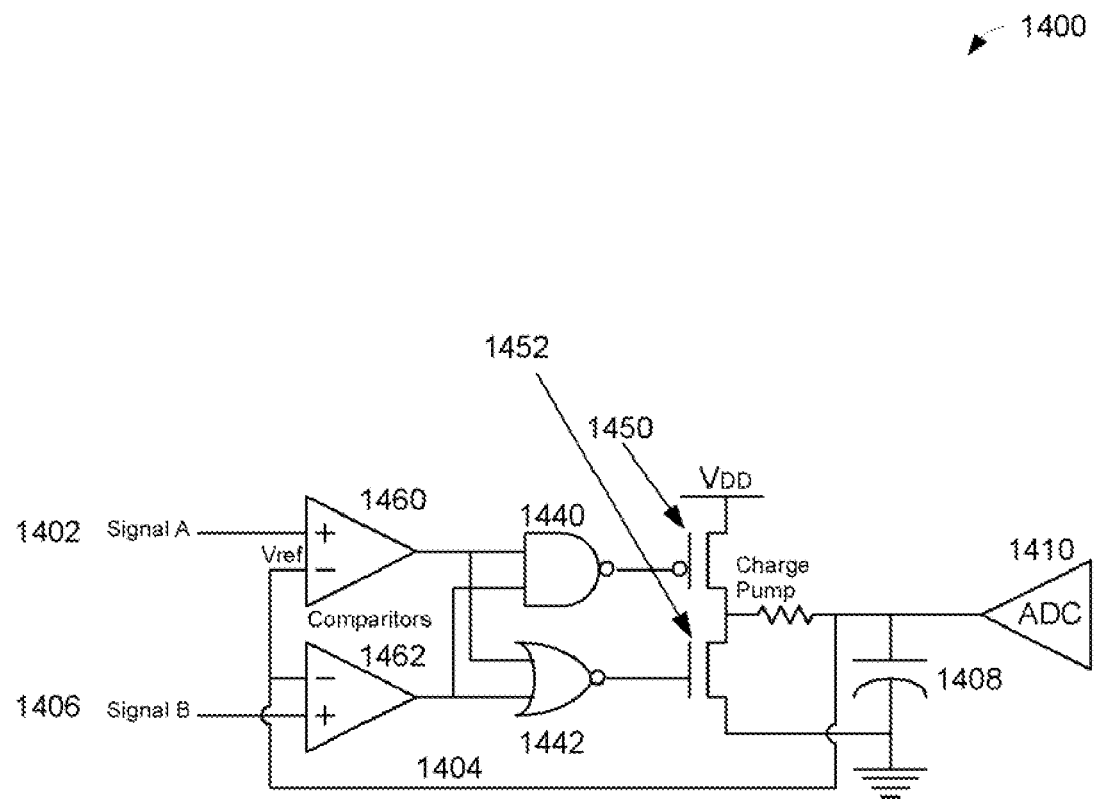
FIG. 14 illustrates one embodiment of the present invention showing a diagram of a circuit.

FIG. 14 illustrates, generally at 1400, one embodiment of the present invention, showing a diagram of a circuit. In this circuit, Vref (1404) is internally generated. The circuit senses whether the cross-point is above or below Vref (1404) as previously shown. It then uses this information to drive a charge pump (P-Channel FET (1450) via NAND gate 1440 and N-Channel FET (1452) via NOR gate 1442) that will increase or decrease the voltage on the capacitor (1408). The voltage on the capacitor (1404) is then feed back to the negative input of the comparators (1460 and 1462) as Vref (1404).

With the circuit (1400) as shown in FIG. 14, the circuit (1400) will adjust Vref (1404) to be positioned at the cross-point of Signal A (1402) and Signal B (1406). Any differences between Vref (1404) and the actual cross-point will make a minor adjustment to bring the two (Vref (1404) and actual cross-point) closer together.

Once the Vref (1404) voltage as illustrated in FIG. 14 has stabilized near the cross-point, the voltage on Vref (1404) may be read by the Analog to Digital converter (1410) and fed back to the user (not shown in FIG. 14) as a digital value through JTAG (not shown in FIG. 14), a readable register value (not shown in FIG. 14), or any other reading mechanism (not shown in FIG. 14).

Some of the advantages of the circuit as illustrated in FIG. 14 are:
  1) The receiver (as embodied and illustrated in FIG. 14 as the front end+input on 1460, +input on 1462, and 1404) will be optimized to receive the differential signal (1402, 1406) by tracking and adjusting for the cross-point.
  2) The actual cross-point value may be read.

One of skill in the art will appreciate that the circuitry as illustrated in FIG. 14 may take multiple forms yet perform the same functions. For example, P-Channel FET (1450) and N-Channel FET (1452) perform switching functions to allow respectively the capacitor (1408) to charge up and down in voltage. Thus the FET may be replaced with an equivalent function such as, but not limited to, a controlled current source, a resistive network, a transmission gate, logic switches, bus switches, or other types of switches. Likewise the function of capacitor 1408 is that of an integrator and functional equivalents may be used, such as, but not limited to a sample and hold, etc.

Figure 15:
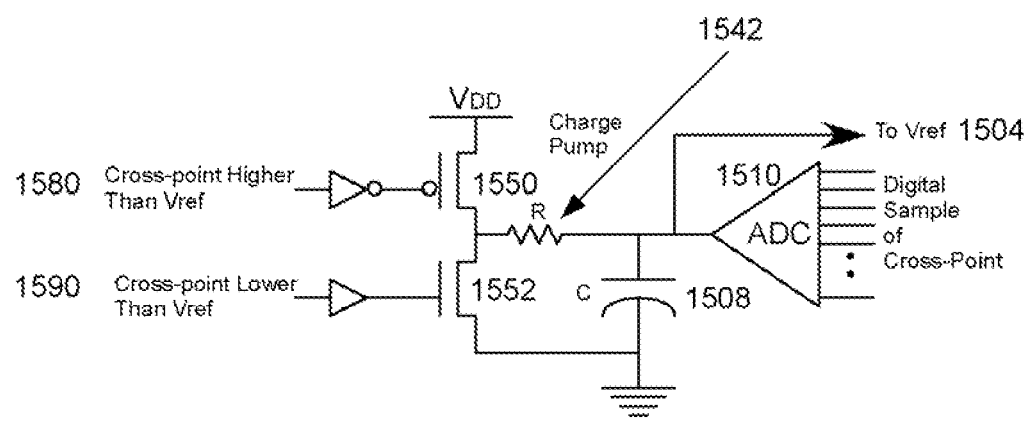
FIG. 15 illustrates one embodiment of the present invention showing details of a charge pump.

FIG. 15, generally at 1500, illustrates one embodiment of the present invention showing details of a charge pump. The charge pump will accept indications that the cross-point is too high (1580) or too low (1590), and will adjust Vref (1504) to match. Once the circuit (generally at 1500) has stabilized, the value of Vref (1504) may be read by the Analog to Digital Converter (1510).

In FIG. 15, the two signals "Cross-point Higher than Vref" (CPH) (1580) and "Cross-point Lower than Vref" (CPL) (1590) are brought in as discrete digital signals. When CPH is high, the P-Channel FET (1550) turns on, raising the voltage on the capacitor C (1508). When CPL is high, the N-Channel FET (1552) turns on lowering the voltage on the capacitor C (1508). The RC time constant between R (1542) and C (1508) can be optimized to allow slow charging of the capacitor (1508) and more averaging operation, or the RC time constant can be adjusted for faster charging of the capacitor (1508) and quick acquisition of the cross-point signal.

In FIG. 15, the voltage on capacitor C (1508) may be returned to input amplifiers (not shown) for use as the Vref (1504), so that the Vref (1504) signal accurately indicates the cross point. In the case of multiple charge pumps the Vref output may be summed with others.

The analog to digital converter (1510) may be used to sense the voltage on the capacitor (1508), allowing the user (not shown) to read the detected cross-point and possibly use that reading to adjust the signal (such as, but not limited to the input signal such as Signal A and/or Signal B in FIG. 14,) to improve the cross-point and signal integrity.

While the present invention has been illustrated via embodiments showing a single differential signal, one of skill in the art will appreciate that the techniques disclosed may be used where multiple differential signals are present. For example, on parallel busses such as a microprocessor having 64 parallel signals, a backplane or motherboard having parallel busses of widths from 2 to 1024 or more, etc.

Unstable cross-points may be caused by differences between high and low transitions. Other unstable cross-points may be truly random occurrences. If the cause of the unstable cross-point can be identified and cross-point sampling can be done based upon the cause, it may be possible to have multiple cross-point detection circuits working on a single differential pair.

Figure 16:
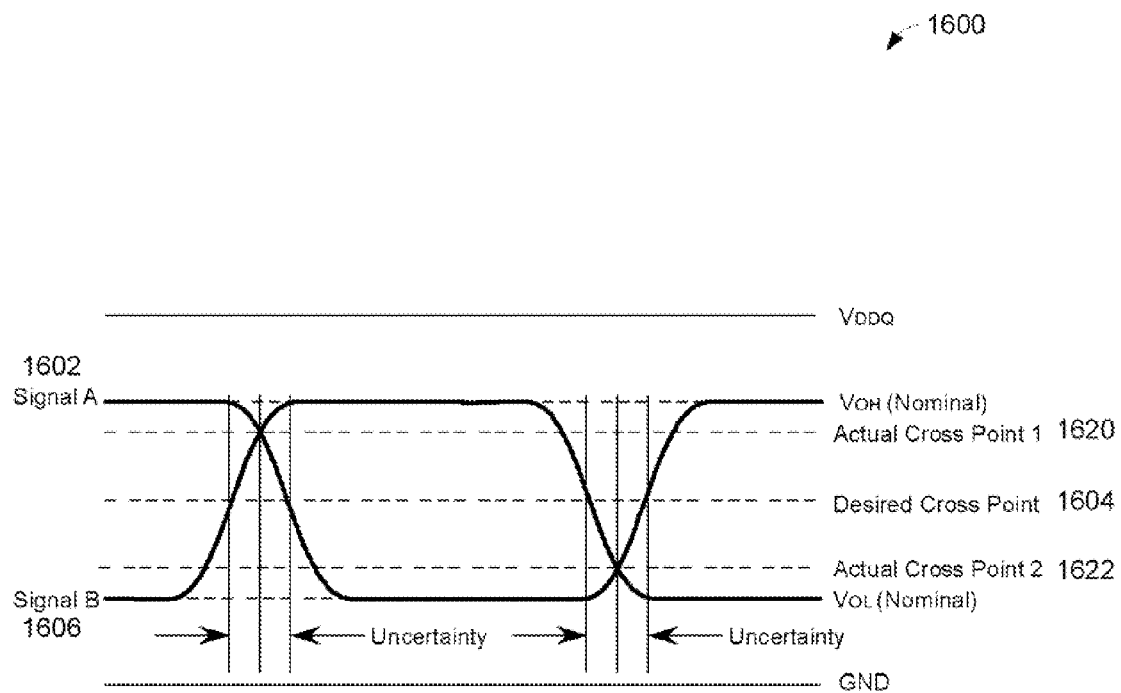
FIG. 16 illustrates one embodiment of the present invention showing actual crosspoints and an example of a differential waveform.

FIG. 16, generally at 1600, is an example of a differential waveform (Signal A (1602) and Signal B (1606)) where the cross-point associated with a logic low differential transition is occurring at a different level (Actual Cross Point 1 (1620)) than the cross-point of a logic high transition (Actual Cross Point 2 (1622)). The Desired Cross Point 1604 is shown for reference. Measuring the Actual Cross Points (1620 and 1622) and relating them to the Desired Cross Point 1604 may provide enough information to identify the cause of the cross point variation (for example, in this case, one leg of the differential pair arrived earlier than the other).

When reporting errors, specified conditions may be isolated and reduced to logic indications. These indications may be used to identify functional/failing or parametric conditions of the associated signals. If a circuit similar to FIG. 15 is used to sense the cross-points, a circuit may be set up to sense the logic high cross-points and a separate circuit set up to sense the logic low cross-points. The logic state of the input could be used to select the circuit for sensing the high or low logic cross-points.

One of skill in the art will appreciate that cause-isolated cross-point values can be individually treated the same as other cross-point measurements as illustrated in previous examples discussed. This includes checking for windows, reporting an individual value, reporting an average, etc.

Figure 17:
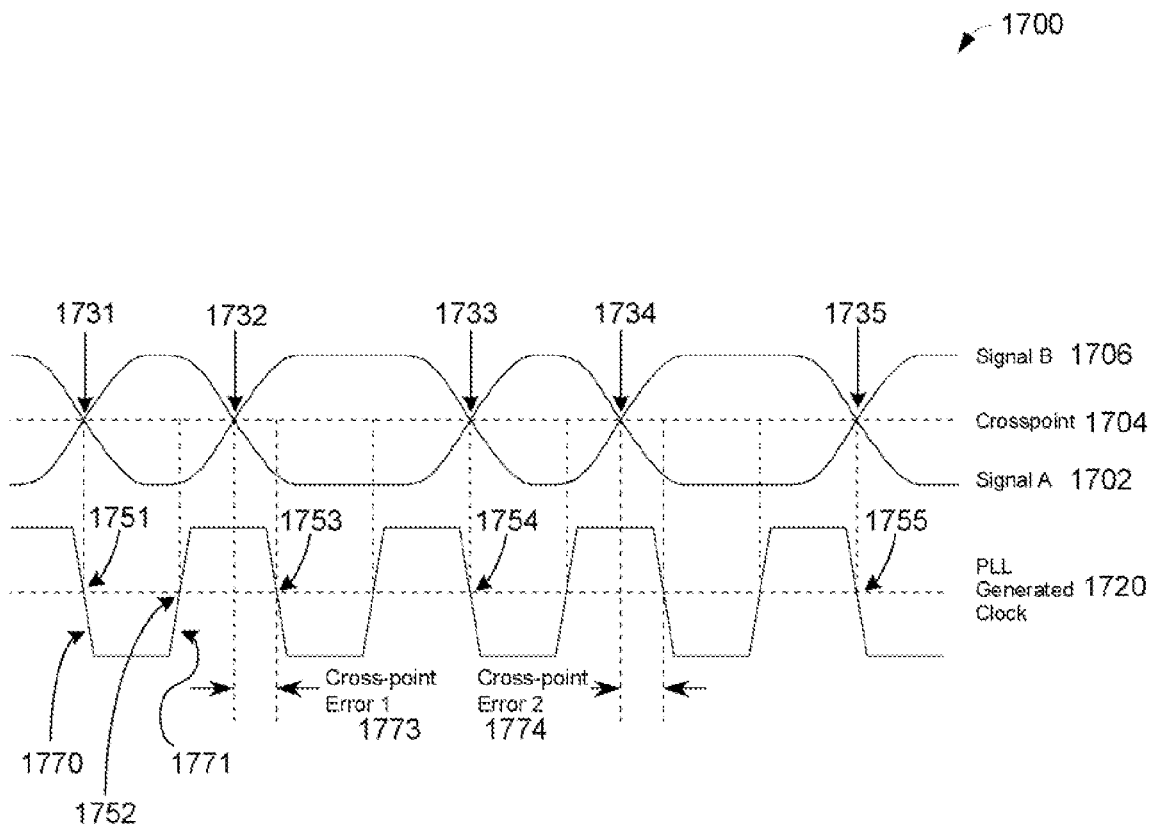
FIG. 17 illustrates one embodiment of the present invention showing crosspoint errors and an example of a differential waveform.

As discussed earlier, an unstable cross-point may cause jitter in the differential signal. Jitter may lead to uncertainty in the data capture and a reduction in the usable part of a cycle time. The ability for a user to capture and read a jitter level may assist him in identifying signal integrity issues and other transmission line problems. FIG. 17 shows, generally at 1700, an example of a differential waveform that has considerable jitter in the cross-point timing. In the figure, it appears that the differential logic high signals are taking a different portion of the total cycle time than the differential logic low signals. The figure has been simplified to only show the jitter, however the jitter may have many causes such as improperly positioned cross-points or rising edges not matching falling edges.

Also in FIG. 17 is shown is a stable internal clock (PLL Generated Clock (1720)). The clock may be generated through clock recovery from encoded data, or it may be locally generated from a reference clock. Regardless of the source of the clock, it should be stable relative to the incoming differential signal (Signal A (1702) and Signal B (1706)), except for the jitter on the incoming differential signal (1702, 1706). Most applications would use a PLL to isolate the clock from jitter sources and provide the stable reference clock; therefore, the clock (1720) is referred to as the "PLL Generated Clock" (PGC) (1720) in FIG. 17, however the invention is not so limited and it is not required that the clock be PLL generated. The PGC (1720) could be any type of reference clock used to capture data and align with the incoming signal (1702, 1706). For reference the Crosspoint 1704 is denoted.

To identify the jitter in FIG. 17, the illustration has five cross-points, numbered 1731, 1732, 1733, 1734, and 1735. The PLL Generated Clock (1720) is shown as an example of an internal data capture clock, however the data capture could be on any edge of the clock or an offset of the clock. The example is set up to show the falling edge of the clock (such as 1770) aligned with the start of the new cycle and the rising edge of the clock (such as 1771) positioned in the center of the cycle to capture the data at the optimum location. The example shows how jitter is causing a shifting of these relationships.

In FIG. 17, cross-point 1731 is perfectly aligned with the PLL Generated Clock (PGC) (1720), therefore this cross-point would be considered correct (no jitter) in the example. The cross-point 1731 is aligned with the falling edge (such as 1770) of the clock (1720), indicating the end/start of the cycle at 1751. The rising edge of the clock (such as 1771) at 1752 should be ideally positioned in the center of the cycle for data capture (but is not in the illustration due to jitter).

In FIG. 17, cross-point 1732 is early and does not match the falling edge of the PGC (1720) at 1753. This is noted as a "Cross-point Error 1" (1773) in FIG. 17. The user may capture this error (1773) by feeding the signals (1702, 1706, 1720) into a circuit, and feeding the outputs of the circuitry into a measurement system, such as, but not limited to, the charge pump as illustrated in FIG. 14 and FIG. 15. The cross-point errors may be accumulated and read by the user, or used as part of a self-adjusting system to compensate, etc.

In FIG. 17, cross-point 1733 is again aligned with the clock (1720) at 1754 and contains no errors.

In FIG. 17, cross-point 1734 has an error (Cross-point Error 2 (1774)) similar to cross-point 1732, and would generate an error reading.

In FIG. 17, cross-point 1735 is again aligned with the clock (1720) at 1755 and contains no errors.

As noted in the discussion above and with the previous examples, errors in the cross-point may be isolated and reported in several ways, for example;

1) An accumulation of all errors over time and reported as a straight "jitter" quantity
2) Sampled as a single point and reported
3) Isolated and accumulated, such as capturing all cross-points of one polarity and reporting an accumulated value
4) Reporting only cross-points that violate a timing window.

Figure 18:
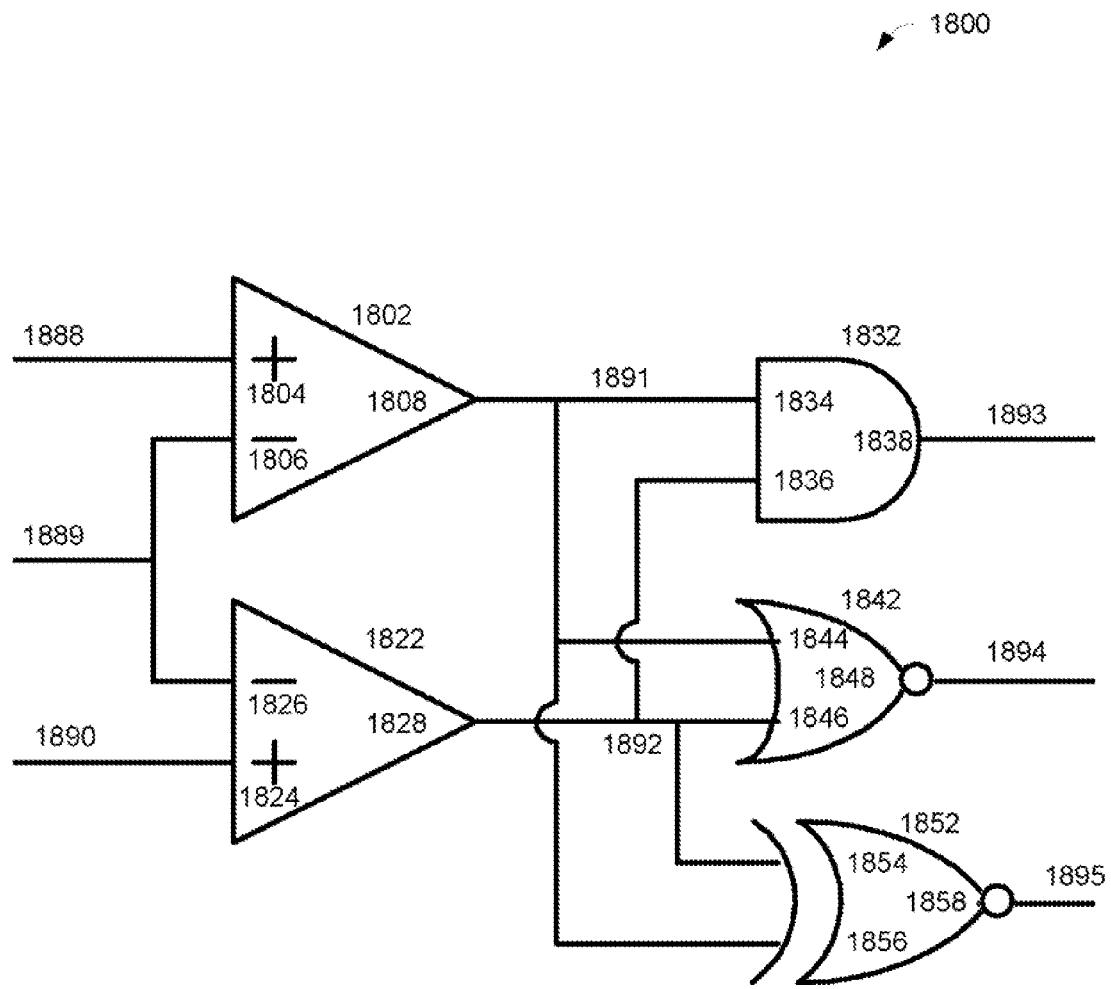
FIG. 18 illustrates one embodiment of the present invention showing a representation of a cross-point detection apparatus in logical form.

FIG. 18 illustrates, generally at 1800, one embodiment of the present invention, showing a representation of a cross-point detection apparatus. A first comparator (1802) having a first input (1804), a second input (1806), and an output (1808), the first comparator (1802) first input (1804) capable of being coupled to receive a first input (1888) from a differential signal, the first comparator (1802) second input (1806) coupled to receive a reference voltage (1889), a second comparator (1822) having a first input (1824) and a second input (1826) and an output (1828), the second comparator (1822) first input (1824) capable of being coupled to receive a second input 1890 from a differential signal, the second comparator (1822) second input (1826) coupled to receive the reference voltage (1889), a AND (1832) gate having a first input (1834), a second input (1836), and an output (1838), the AND gate (1832) first input (1834) coupled (1891) to receive the first comparator output (1808), the AND gate (1832) second input (1836) coupled (1892) to receive the second comparator (1822) output (1828), and the AND gate (1832) output (1838) capable of being received (1893), a NOR gate (1842) having a first input (1844), a second input (1846), and an output (1848), the NOR gate (1842) first input (1844) coupled (1891) to receive the first comparator (1802) output (1808), the NOR gate (1842) second input (1846) coupled (1892) to receive the second comparator (1822) output (1828), and the NOR gate (1842) output (1848) capable of being received (1894), a XNOR gate (1852) having a first input (1854), a second input (1856), and an output (1858), the XNOR gate (1852), first input (1856) coupled (1891) to receive the first comparator (1802) output (1808), the XNOR gate (1852) second input (1854) coupled (1892) to receive the second comparator (1822) output (1828), and the XNOR gate (1852) output (1858) capable of being received (1895).

Figure 19:
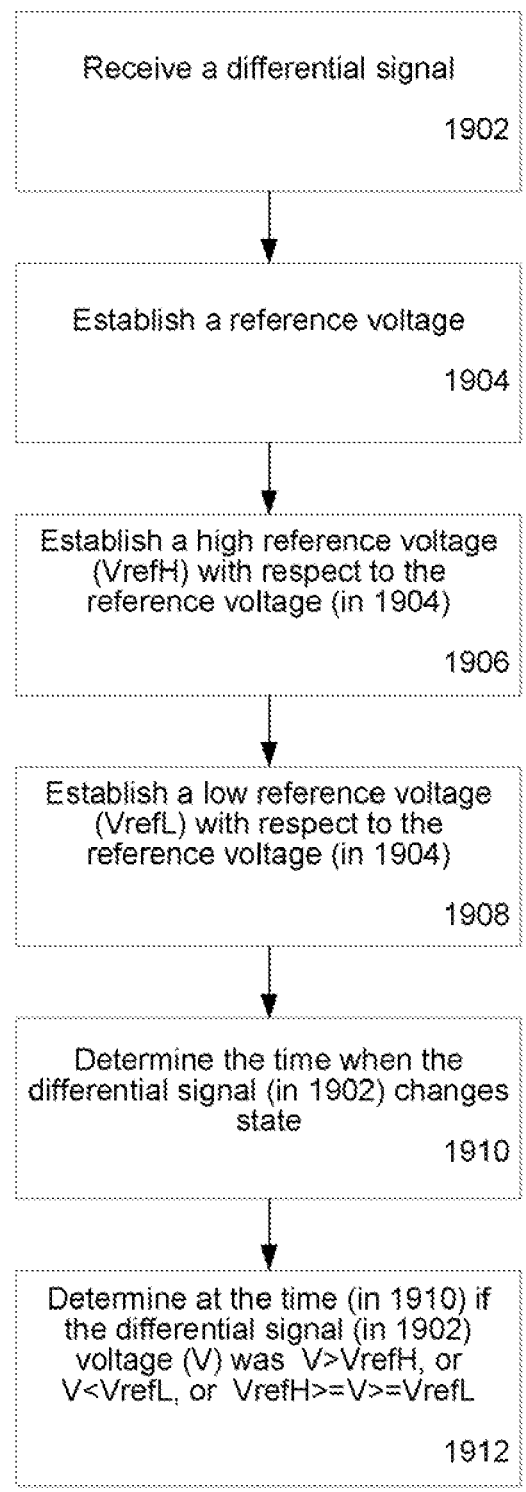
FIG. 19 illustrates one embodiment of the present invention showing a representation of a cross-point detection method in flow chart form.

FIG. 19 illustrates, generally at 1900, one embodiment of the present invention, showing a representation of a cross-point detection method. At 1902 a differential signal is received, at 1904 a reference voltage is established, at 1906 a high reference voltage (VrefH) with respect to the reference voltage (in 1904) is established, at 1908 a low reference voltage (VrefL) with respect to the reference voltage (1904) is established, at 1910 the time when the differential signal (in 1902) changes state is determined, and at 1912 at that time it is determined if the differential signal voltage (V) was V>VrefH, or V<VrefL, or VrefH>=V>=VrefL.

Figure 20:
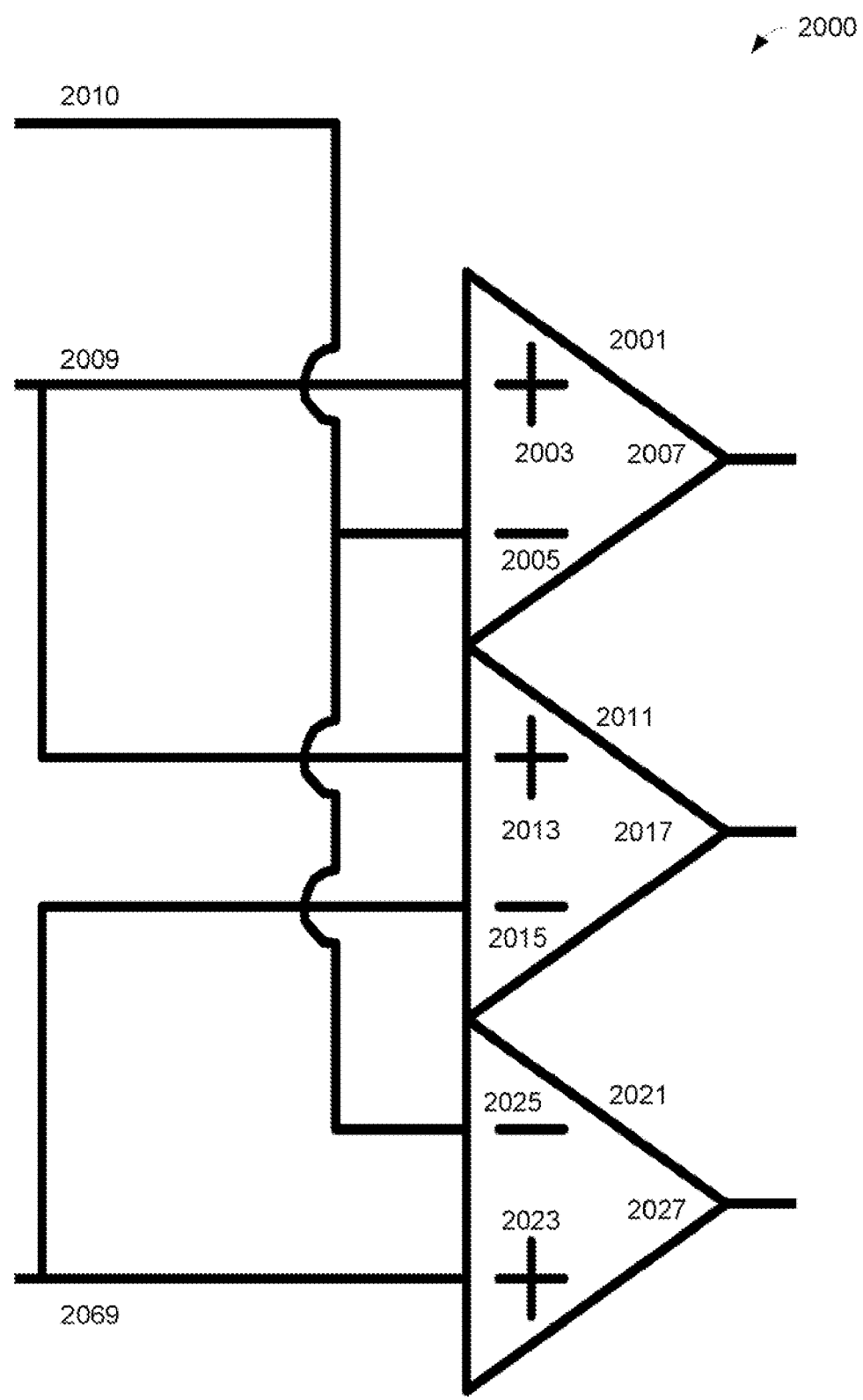
FIG. 20 illustrates one embodiment of the present invention showing a representation of an apparatus in schematic form.

FIG. 20 illustrates, generally at 2000, one embodiment of the present invention, showing a representation of an apparatus. A first comparator (2001) having a first input (2003), a second input (2005), and an output (2007), the first comparator (2001) first input (2003) capable of being coupled to receive a first input (2009) from a differential signal, the first comparator (2001) second input (2005) coupled to receive a reference voltage (2010), a second comparator (2021) having a first input (2023) and a second input (2025) and an output (2027), the second comparator (2021) first input (2023) capable of being coupled to receive a second input (2069) from the differential signal, the second comparator (2021) second input (2025) coupled to receive the reference voltage (2010), a third comparator (2011) having a first input (2013) and a second input (2015) and an output (2017), the third comparator (2011) first input (2013) capable of being coupled to receive the first input (2009) from the differential signal, the second comparator (2011) second input (2015) coupled to receive the second input (2069) from the differential signal.

Figure 21:
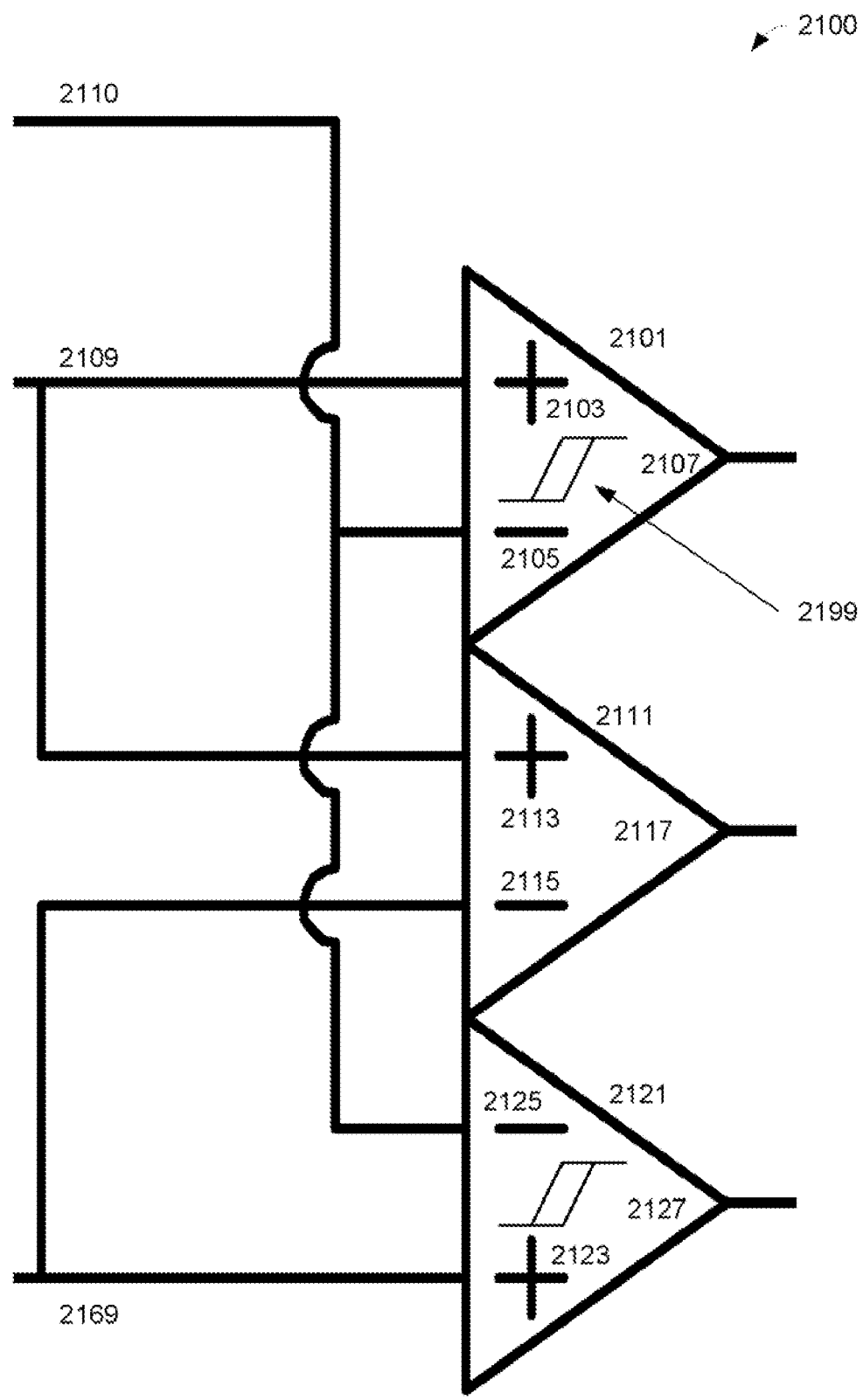
FIG. 21 illustrates one embodiment of the present invention showing a representation of an apparatus in schematic form.

FIG. 21 illustrates, generally at 2100, one embodiment of the present invention, showing a representation of an apparatus. A first comparator (2101) which has hysteresis (as indicated by the hysteresis symbol at (2199)) having a first input (2103), a second input (2105), and an output (2107), the first comparator (2101) first input (2103) capable of being coupled to receive a first input (2109) from a differential signal, the first comparator (2101) second input (2105) coupled to receive a reference voltage (2110), a second comparator having hysteresis (2121) having a first input (2123) and a second input (2125) and an output (2127), the second comparator (2121) first input (2123) capable of being coupled to receive a second input (2169) from the differential signal, the second comparator (2121) second input (2125) coupled to receive the reference voltage (2110), a third comparator (2111) having a first input (2113) and a second input (2115) and an output (2117), the third comparator (2111) first input (2113) capable of being coupled to receive the first input (2109) from the differential signal, the second comparator (2111) second input (2115) coupled to receive the second input (2169) from the differential signal.

Figure 22:
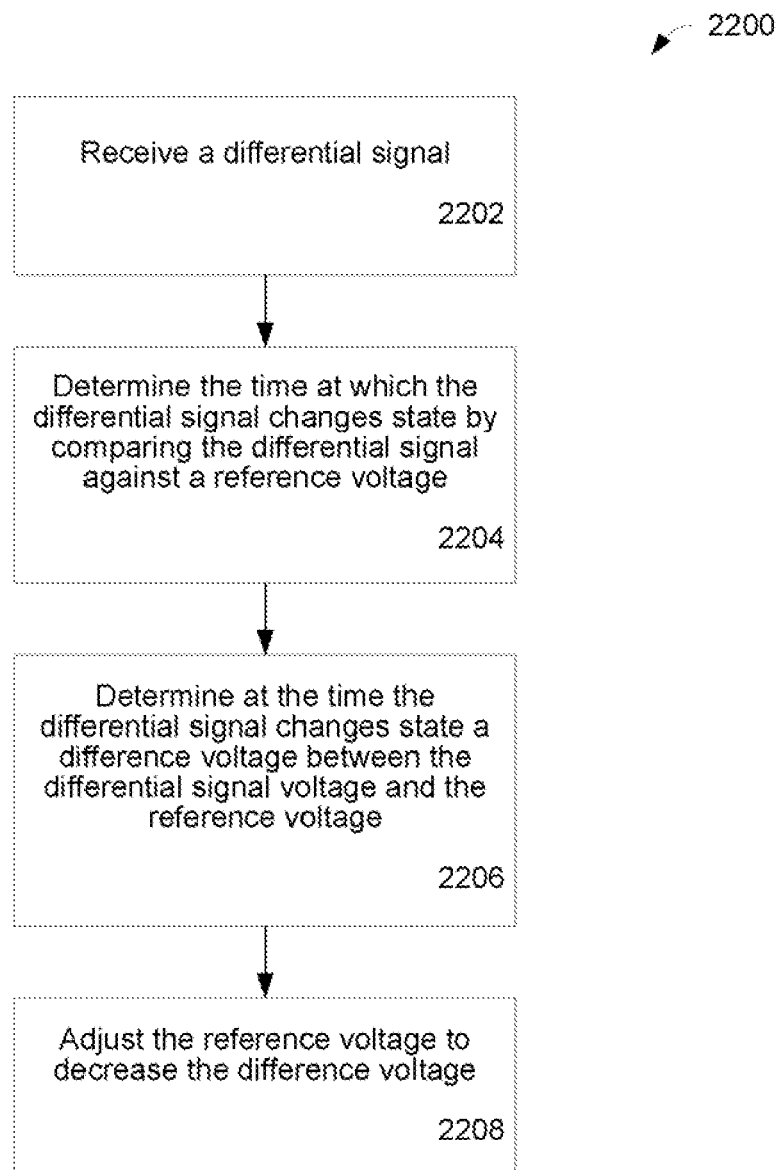
FIG. 22 illustrates one embodiment of the present invention showing a method in flow chart form.

FIG. 22 illustrates, generally at 2200, one embodiment of the present invention, showing a method. At 2202 a differential signal is received, at 2204 the time at which the differential signal changes state is determined by comparing the differential signal against a reference voltage, at 2206 a difference voltage between the differential signal voltage and the reference voltage is determined at the time the differential signal changes state, and at 2208 the reference voltage is adjusted to decrease the difference voltage.

Figure 23:
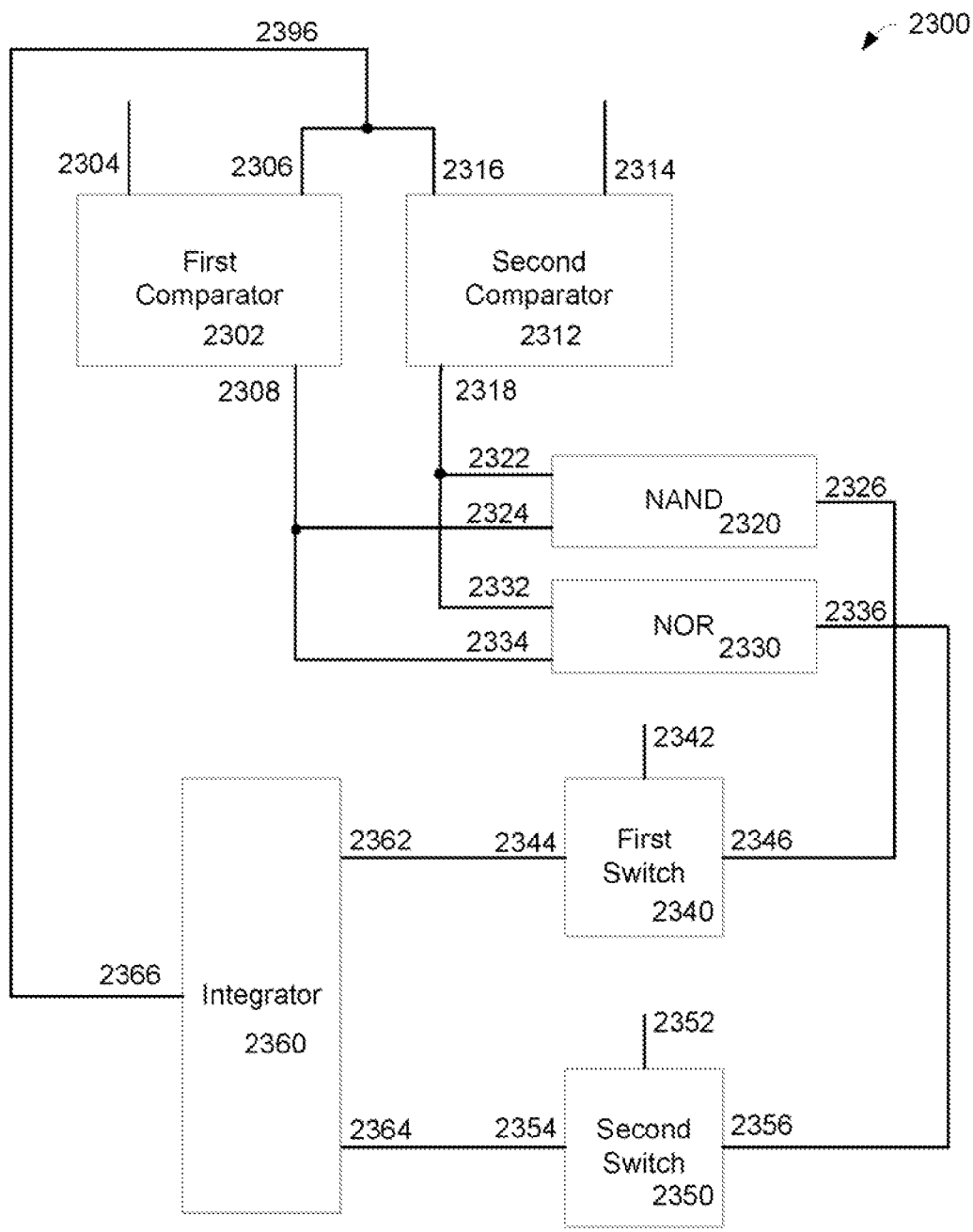
FIG. 23 illustrates one embodiment of the present invention.

FIG. 23 illustrates, generally at 2300, one embodiment of the present invention. A first comparator (2302) having a first input (2304), a second input (2306), and an output (2308), the first comparator (2302) first input (2304) capable of being coupled to receive a first input (A) from a differential signal, the first comparator (2302) second input (2306) coupled to receive a reference voltage (Vref) (2396), a second comparator (2312) having a first input (2314) and a second input (2316) and an output (2318), the second comparator (2312) first input (2314) capable of being coupled to receive a second input (B) from the differential signal, the second comparator (2312) second input (2316) coupled to receive the reference voltage (Vref) (2396), a NAND logic function (2320) having a first input (2324), a second input (2322), and an output (2326), the NAND logic function (2320) first input (2324) coupled to receive the first comparator (2302) output (2308), the NAND logic function (2320) second input (2322) coupled to receive the second comparator (2312) output (2318), a NOR logic function (2330) having a first input (2334), a second input (2332), and an output (2336), the NOR logic function (2330) first input (2334) coupled to receive the first comparator (2302) output (2308), the NOR logic function (2330) second input (2332) coupled to receive the second comparator (2312) output (2318), a first switch (2340) having an input (2342) and output (2344) and a control input (2346), the control input (2346) coupled to the NAND logic function (2320) output (2326), the input (2342) connected to a voltage source higher in voltage than that of the Vref (2396), a second switch (2350) having an input (2352) and output (2354) and a control input (2356), the control input (2356) coupled to the NOR logic function (2330) output (2336), the input (2352) connected to a voltage source lower in voltage than that of the Vref (2396), and an integrator (2360) having a first input (2362), a second input (2364), and an output (2366), the first input (2362) coupled to the first switch (2340) output (2344), the second input (2364) coupled to the second switch (2350) output (2354), and the output (2366) coupled to the Vref (2396).

Figure 24:
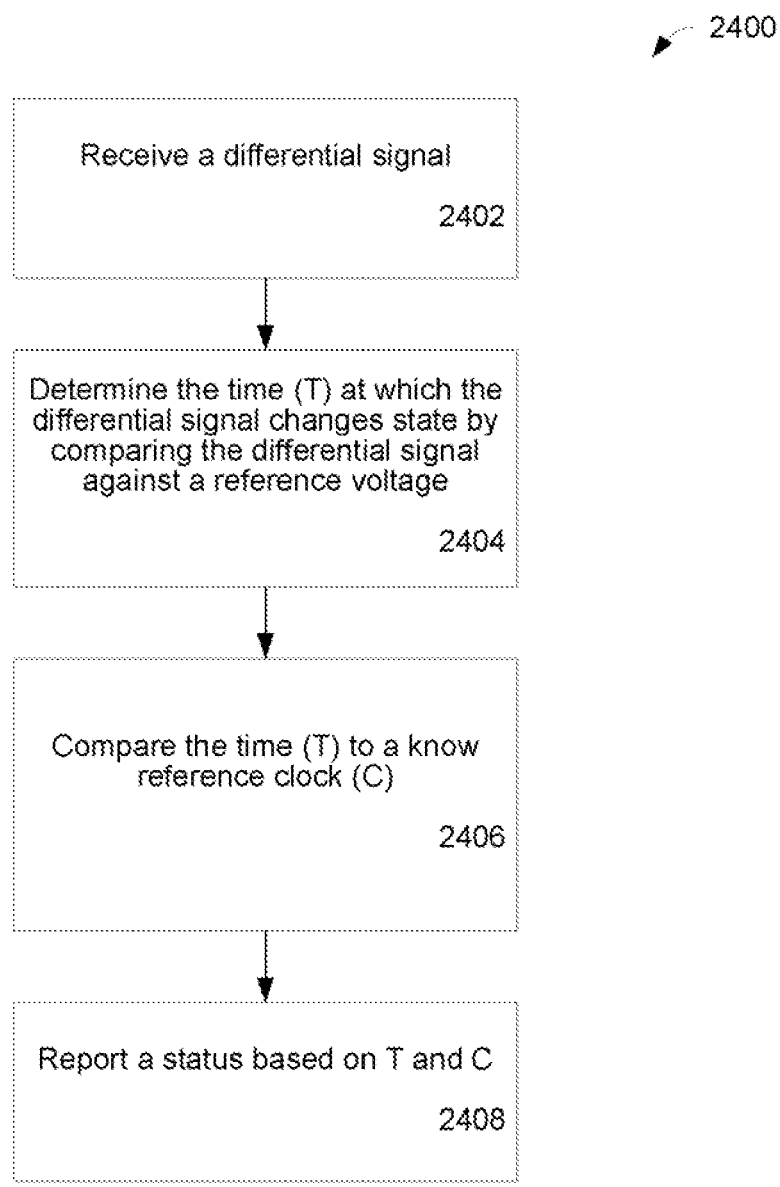
FIG. 24 illustrates one embodiment of the present invention in flow chart form.

FIG. 24 illustrates, generally at 2400, one embodiment of the present invention, showing a method. At 2402 a differential signal is received, at 2404 the time (T) at which the differential signal changes state is determined by comparing the differential signal against a reference voltage, at 2406 the time T is compared to a known clock C, and at 2408 a status is reported based on T and C.

One of skill in the art will appreciate that using the method as illustrated in FIG. 24, jitter may be determined from the reported status at 2408. For example, if the reported status at 2408 is the difference of T to C in femotseconds, then any variation in this would indicate jitter.

Figure 25:
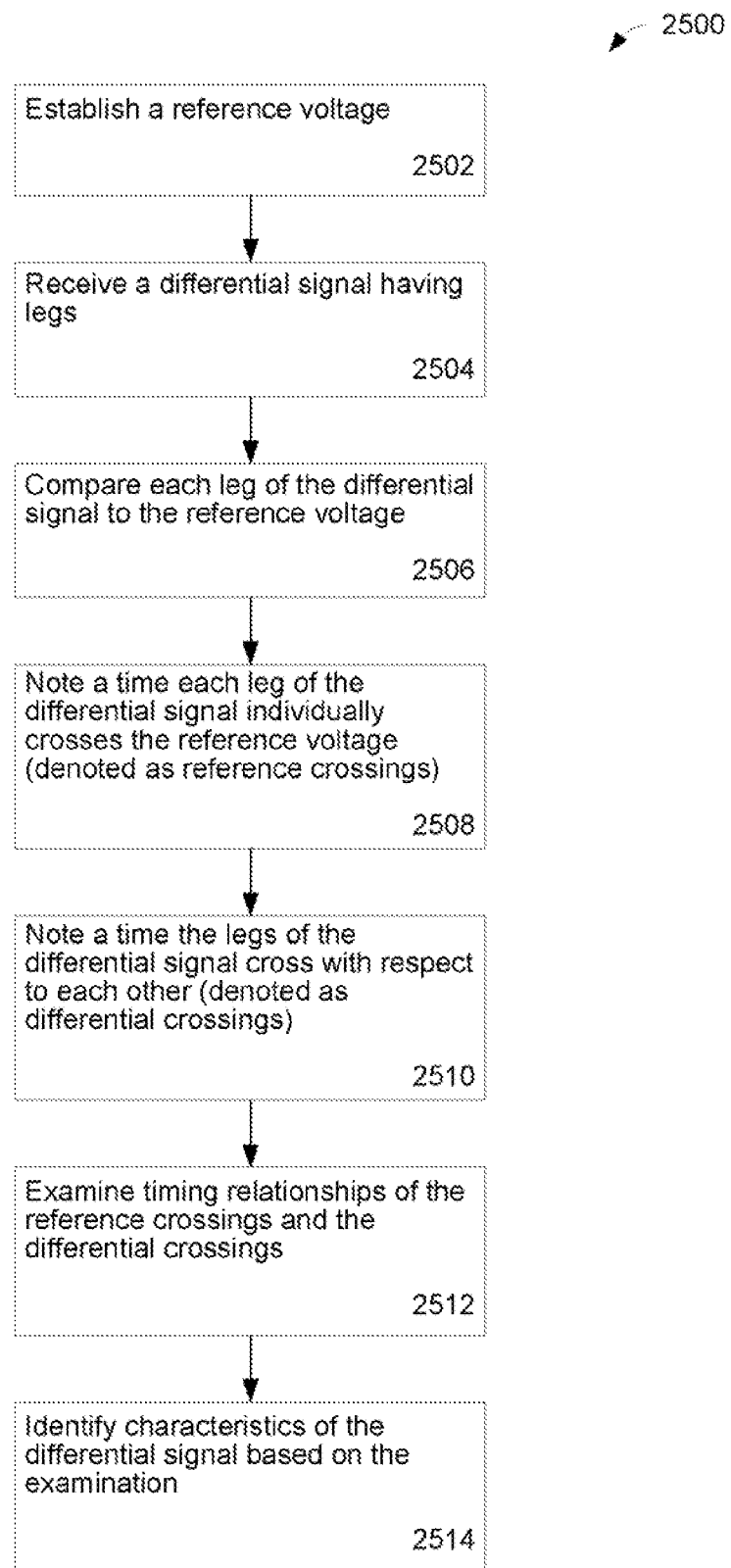
FIG. 25 illustrates one embodiment of the present invention in flow chart form.

FIG. 25 illustrates, generally at 2500, one embodiment of the present invention, showing a method. At 2502 a reference voltage is established. At 2504 a differential signal having legs is received. At 2506 each leg of the differential signal is compared to the reference voltage. At 2508 a time is noted when each leg of the differential signal crosses the reference voltage. This is denoted as a reference crossing. At 2510 a time is noted when the legs of the differential signal cross each other. This is denoted as a differential crossing. At 2512 an examination is made of the timing relationships of the reference crossings and/or the differential crossings. At 2514 an identification of the characteristics of the differential signal are made based on the examination done at 2512.

Figure 26:
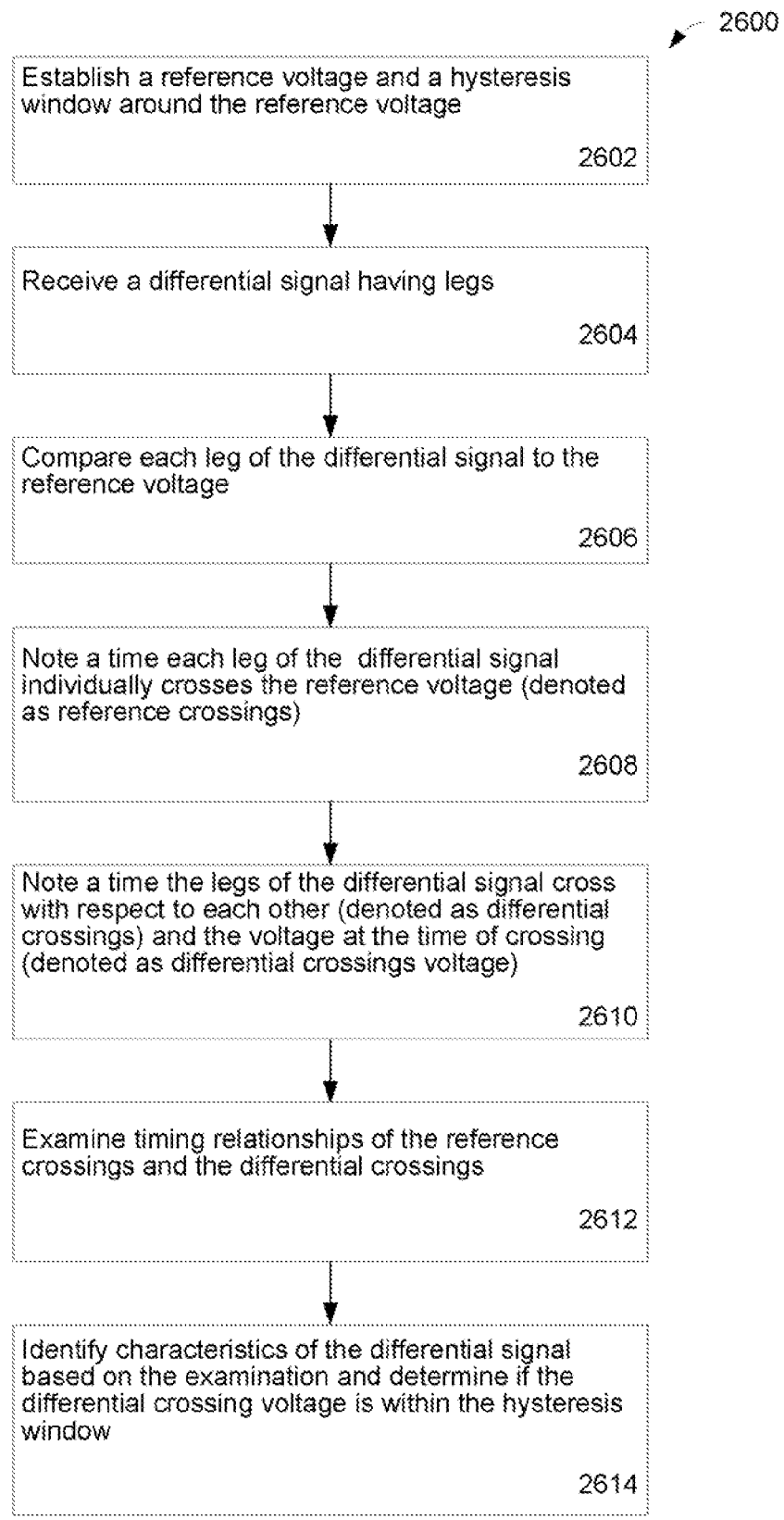
FIG. 26 illustrates one embodiment of the present invention in flow chart form.

FIG. 26 illustrates, generally at 2600, one embodiment of the present invention, showing a method. At 2602 a reference voltage is established and hysteresis window around the reference voltage is established. At 2604 a differential signal having legs is received. At 2606 each leg of the differential signal is compared to the reference voltage. At 2608 a time is noted when each leg of the differential signal crosses the reference voltage. This is denoted as a reference crossing. At 2610 a time is noted when the legs of the differential signal cross each other. This is denoted as a differential crossing. Also noted is the voltage at the time of the differential crossing. This is denoted as differential crossings voltage. At 2612 an examination is made of the timing relationships of the reference crossings and/or the differential crossings. At 2614 an identification of the characteristics of the differential signal are made based on the examination done at 2612 and a determination is made as to whether the differential crossing voltage is within the hysteresis window around the reference voltage as established at 2602.

Figure 27:
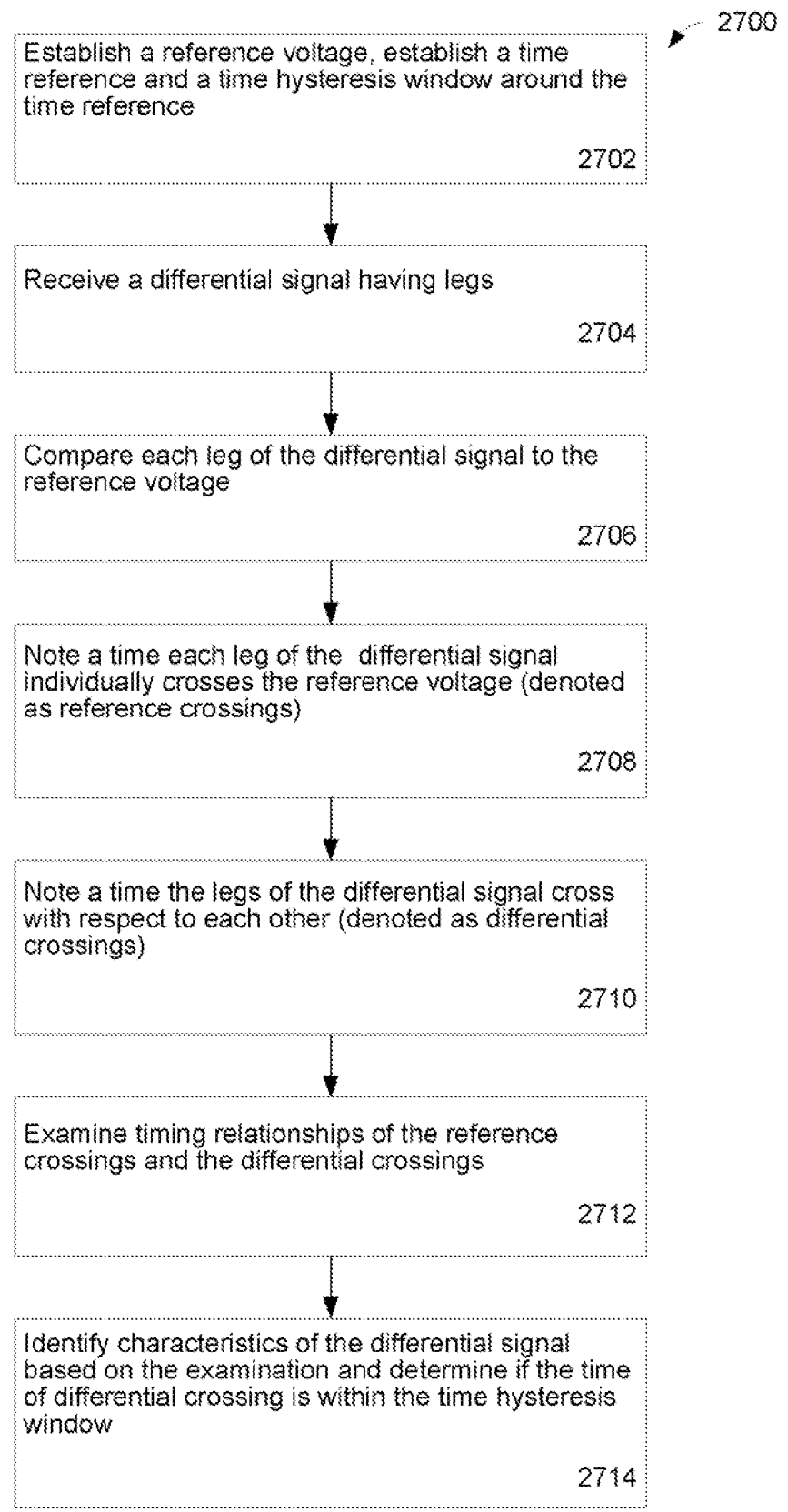
FIG. 27 illustrates one embodiment of the present invention in flow chart form.

FIG. 27 illustrates, generally at 2700, one embodiment of the present invention, showing a method. At 2702 a reference voltage is established and a time reference is established and time hysteresis window around the time reference is established. At 2704 a differential signal having legs is received. At 2706 each leg of the differential signal is compared to the reference voltage. At 2708 a time is noted when each leg of the differential signal crosses the reference voltage. This is denoted as a reference crossing. At 2710 a time is noted when the legs of the differential signal cross each other. This is denoted as a differential crossing. At 2712 an examination is made of the timing relationships of the reference crossings and/or the differential crossings. At 2714 an identification of the characteristics of the differential signal are made based on the examination done at 2712 and a determination is made as to whether the time of differential crossing is within the time hysteresis window around the reference time as established at 2702.

Figure 28:
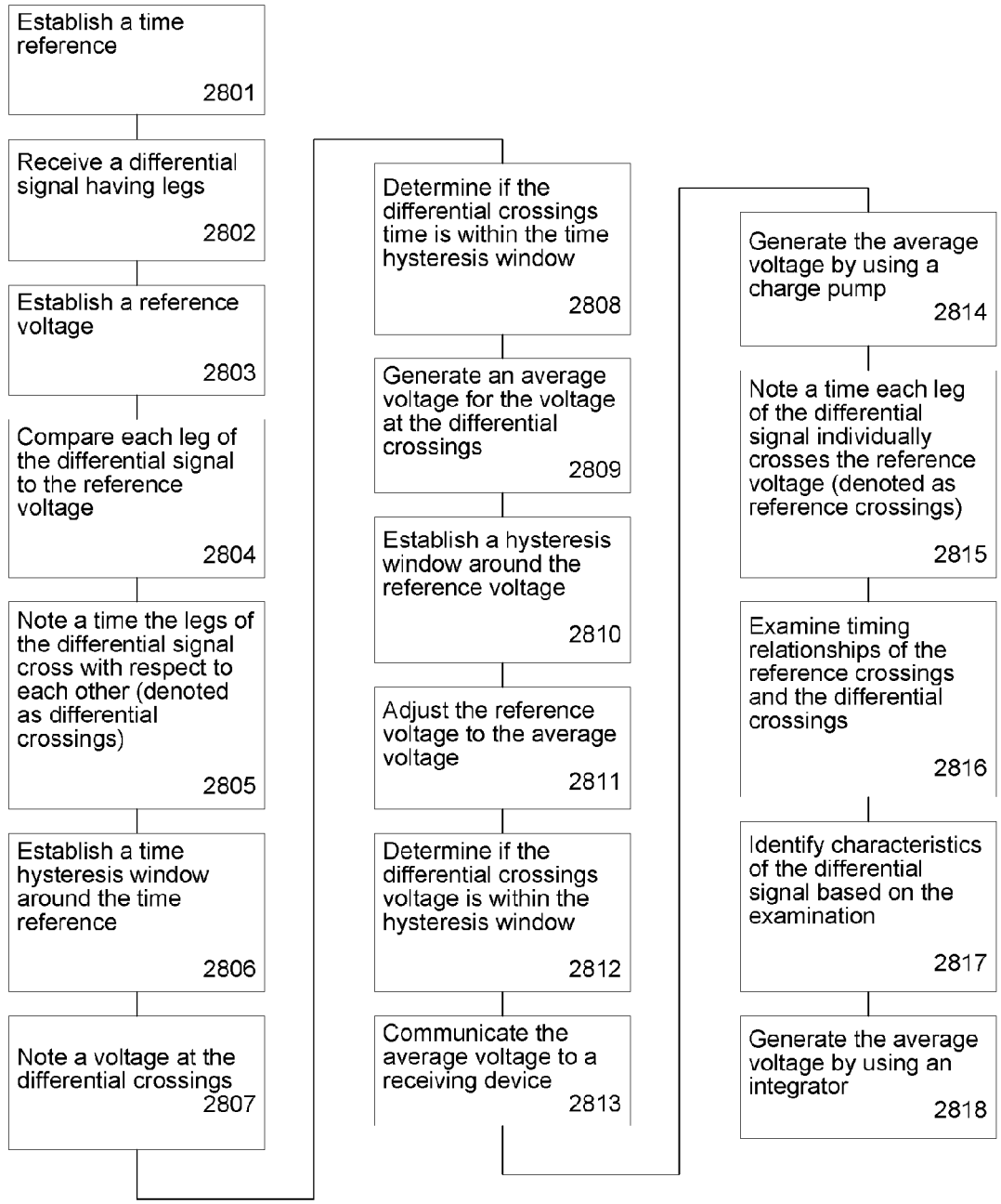
FIG. 28 illustrates embodiments of the present invention.

FIG. 28 illustrates embodiments the invention. At 2801 a time reference is established. At 2802 a differential signal having legs is received. At 2803 a reference voltage is established. At 2804 each leg of the differential signal is compared to the reference voltage. At 2805 a time the legs of the differential signal cross each other is noted (denoted ad differential crossings). At 2806 a time hysteresis window is established around the time reference. At 2807 a voltage is noted at the differential crossings. At 2808 a determination is made if the differential crossings time is within the time hysteresis window. At 2809 an average voltage is generated for the voltage at the differential crossings. At 2810 a hysteresis window is established around the reference voltage. At 2811 adjust the reference voltage to the average voltage. At 2812 determine if the differential crossings voltage is within the hysteresis window. At 2813 communicate the average voltage to a receiving device. At 2814 generate the average voltage by using a charge pump. At 2815 note a time each leg of the differential signal individually crosses the reference voltage (denoted as reference crossings). At 2816 examine the timing relationships of the reference crossings and the differential crossings. At 2817 identify characteristics of the differential signal based on the examination. At 2818 generate the average voltage by using an integrator.

Thus a method and apparatus for cross-point detection have been described.

Figure 1:
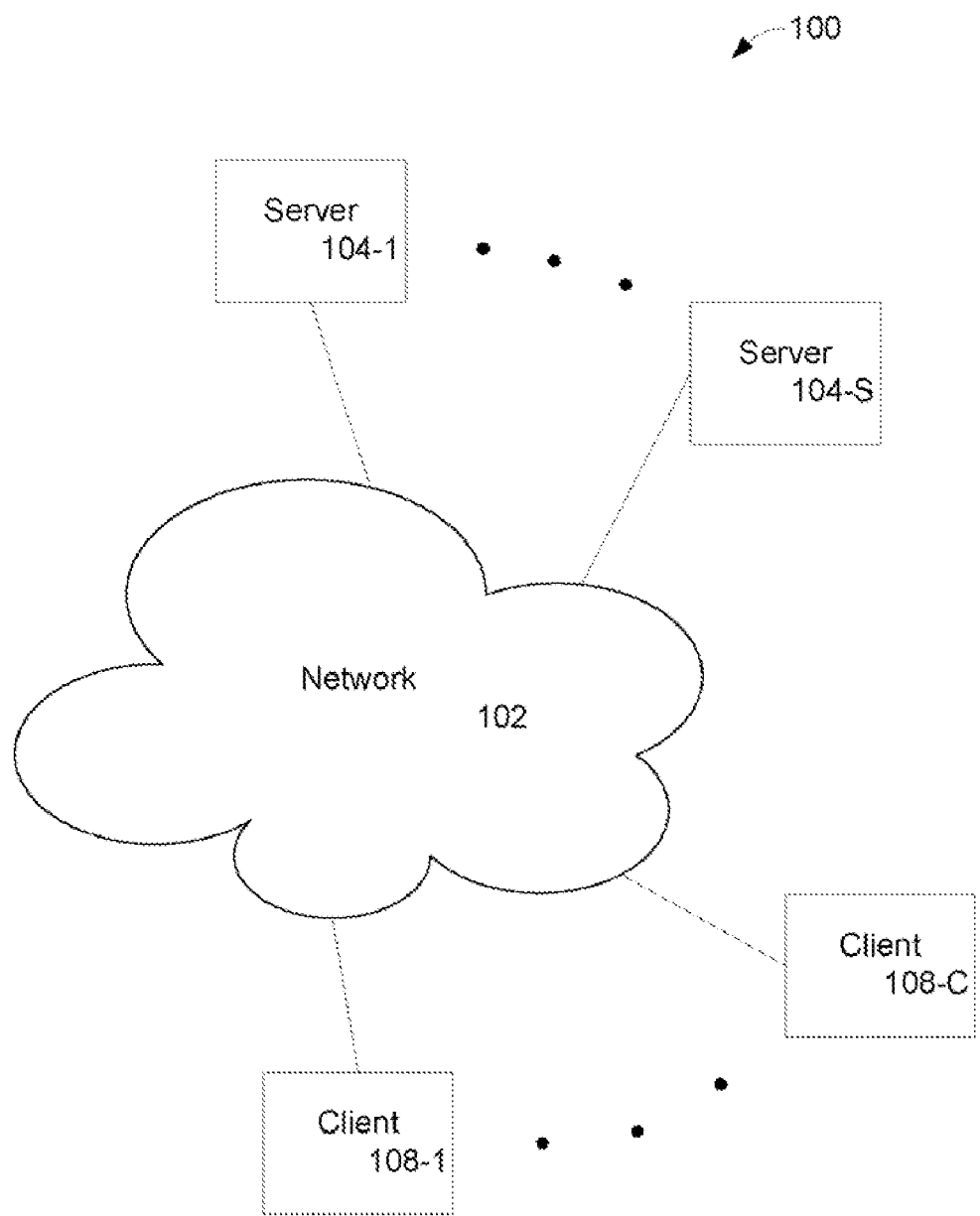
FIG. 1 illustrates a network environment in which the method and apparatus of the invention may be implemented.

FIG. 1 illustrates a network environment 100 in which the techniques described may be applied. The network environment 100 has a network 102 that connects S servers 104-1 through 104-S, and C clients 108-1 through 108-C. More details are described below.

Figure 2:
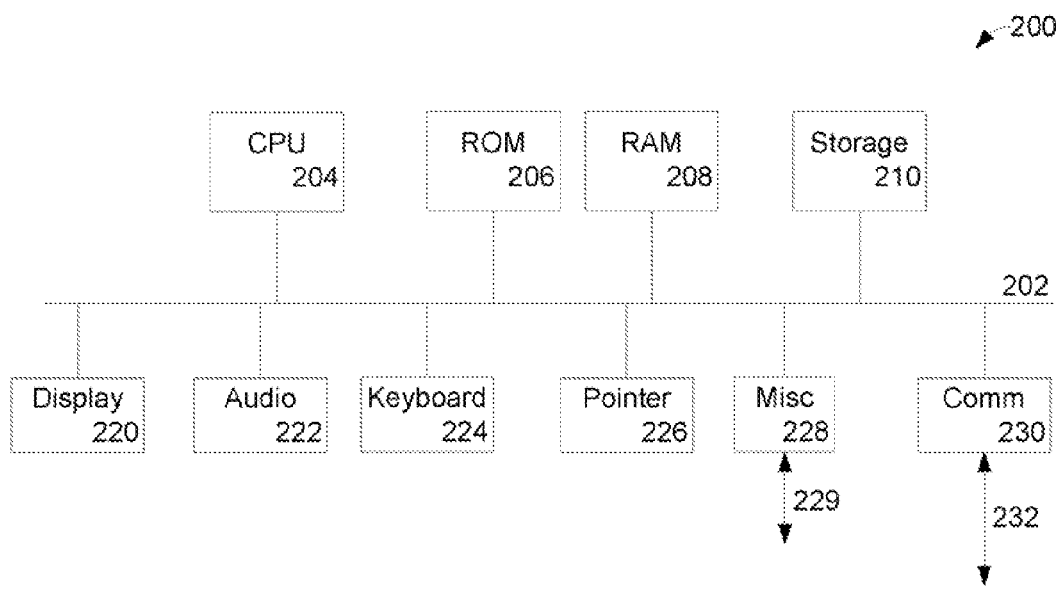
FIG. 2 is a block diagram of a computer system in which some embodiments of the invention may be used.

FIG. 2 is a block diagram of a computer system 200 in which some embodiments of the invention may be used and which may be representative of use in any of the clients and/or servers shown in FIG. 1, as well as, devices, clients, and servers in other Figures. More details are described below.

Referring back to FIG. 1, FIG. 1 illustrates a network environment 100 in which the techniques described may be applied. The network environment 100 has a network 102 that connects S servers 104-1 through 104-S, and C clients 108-1 through 108-C. As shown, several computer systems in the form of S servers 104-1 through 104-S and C clients 108-1 through 108-C are connected to each other via a network 102, which may be, for example, a corporate based network. Note that alternatively the network 102 might be or include one or more of: the Internet, a Local Area Network (LAN), Wide Area Network (WAN), satellite link, fiber network, cable network, or a combination of these and/or others. The severs may represent, for example, disk storage systems alone or storage and computing resources. Likewise, the clients may have computing, storage, and viewing capabilities. The method and apparatus described herein may be applied to essentially any type of communicating means or device whether local or remote, such as a LAN, a WAN, a system bus, etc. Thus, the invention may find application at both the S severs 104-1 through 104-S, and C clients 108-1 through 108-C.

Referring back to FIG. 2, FIG. 2 illustrates a computer system 200 in block diagram form, which may be representative of any of the clients and/or servers shown in FIG. 1. The block diagram is a high level conceptual representation and may be implemented in a variety of ways and by various architectures. Bus system 202 interconnects a Central Processing Unit (CPU) 204, Read Only Memory (ROM) 206, Random Access Memory (RAM) 208, storage 210, display 220, audio, 222, keyboard 224, pointer 226, miscellaneous input/output (I/O) devices 228, and communications 230. The bus system 202 may be for example, one or more of such buses as a system bus, Peripheral Component Interconnect (PCI), Advanced Graphics Port (AGP), Small Computer System Interface (SCSI), Institute of Electrical and Electronics Engineers (IEEE) standard number 1394 (FireWire), Universal Serial Bus (USB), etc. The CPU 204 may be a single, multiple, or even a distributed computing resource. Storage 210, may be Compact Disc (CD), Digital Versatile Disk (DVD), hard disks (HD), optical disks, tape, flash, memory sticks, video recorders, etc. Display 220 might be, for example, an embodiment of the present invention. Note that depending upon the actual implementation of a computer system, the computer system may include some, all, more, or a rearrangement of components in the block diagram. For example, a thin client might consist of a wireless hand held device that lacks, for example, a traditional keyboard. Thus, many variations on the system of FIG. 2 are possible.

For purposes of discussing and understanding the invention, it is to be understood that various terms are used by those of skill in the art to describe techniques and approaches. Furthermore, in the description, for purposes of explanation, numerous specific details are set forth in order to provide a thorough understanding of the present invention. It will be evident, however, to one of skill in the art that the present invention may be practiced without these specific details. In some instances, well-known structures and devices are shown in block diagram form, rather than in detail, in order to avoid obscuring the present invention. These embodiments are described in sufficient detail to enable those of skill in the art to practice the invention, and it is to be understood that other embodiments may be utilized and that logical, mechanical, electrical, and other changes may be made without departing from the scope of the present invention.

Some portions of the description may be presented in terms of algorithms and symbolic representations of operations on, for example, data bits within a computer memory, and/or logic circuitry. These algorithmic descriptions and representations are the means used by those of skill in the arts to most effectively convey the substance of their work to others of skill in the art. An algorithm is here, and generally, conceived to be a self-consistent sequence of acts leading to a desired result. The acts are those requiring physical manipulations of physical quantities. Usually, though not necessarily, these quantities take the form of electrical or magnetic signals capable of being stored, transferred, combined, compared, and otherwise manipulated. It has proven convenient at times, principally for reasons of common usage, to refer to these signals as bits, values, elements, symbols, characters, terms, numbers, or the like.

It should be borne in mind, however, that all of these and similar terms are to be associated with the appropriate physical quantities and are merely convenient labels applied to these quantities. Unless specifically stated otherwise as apparent from the discussion, it is appreciated that throughout the description, discussions utilizing terms such as "processing" or "computing" or "calculating" or "determining" or "displaying" or the like, can refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission, or display devices.

Further, any of the methods according to the present invention can be implemented in hard-wired circuitry, by programmable logic, or by any combination of hardware and software.

An apparatus for performing the operations herein can implement the present invention. This apparatus may be specially constructed for the required purposes, or it may comprise a general-purpose computer, selectively activated or reconfigured by a computer program stored in the computer. Such a computer program may be stored in a computer readable storage medium, such as, but not limited to, any type of disk including floppy disks, hard disks, optical disks, compact disk-read only memories (CD-ROMs), and magnetic-optical disks, read-only memories (ROMs), random access memories (RAMs), electrically programmable read-only memories (EPROM)s, electrically erasable programmable read-only memories (EEPROMs), FLASH memories, magnetic or optical cards, etc., or any type of media suitable for storing electronic instructions either local to the computer or remote to the computer.

The algorithms and displays presented herein are not inherently related to any particular computer or other apparatus. Various general-purpose systems may be used with programs in accordance with the teachings herein, or it may prove convenient to construct more specialized apparatus to perform the required method. For example, any of the methods according to the present invention can be implemented in hard-wired circuitry, by programming a general-purpose processor, or by any combination of hardware and software. One of ordinary skill in the art will immediately appreciate that the invention can be practiced with computer system configurations other than those described, including hand-held devices, multiprocessor systems, microprocessor-based or programmable consumer electronics, digital signal processing (DSP) devices, set top boxes, network PCs, minicomputers, mainframe computers, and the like. The invention can also be practiced in distributed computing environments where tasks are performed by remote processing devices that are linked through a communications network.

The methods of the invention may be implemented using computer software. If written in a programming language conforming to a recognized standard, sequences of instructions designed to implement the methods can be compiled for execution on a variety of hardware platforms and for interface to a variety of operating systems. In addition, the present invention is not described with reference to any particular programming language. It will be appreciated that a variety of programming languages may be used to implement the teachings of the invention as described herein. Furthermore, it is common in the art to speak of software, in one form or another (e.g., program, procedure, application, driver, . . . ), as taking an action or causing a result. Such expressions are merely a shorthand way of saying that execution of the software by a computer causes the processor of the computer to perform an action or produce a result.

It is to be understood that various terms and techniques are used by those knowledgeable in the art to describe communications, protocols, applications, implementations, mechanisms, etc. One such technique is the description of an implementation of a technique in terms of an algorithm or mathematical expression. That is, while the technique may be, for example, implemented as executing code on a computer, the expression of that technique may be more aptly and succinctly conveyed and communicated as a formula, algorithm, or mathematical expression. Thus, one of skill in the art would recognize a block denoted A+B=C as an additive function whose implementation in hardware and/or software would take two inputs (A and B) and produce a summation output (C). Thus, the use of formula, algorithm, or mathematical expression as descriptions is to be understood as having a physical embodiment in at least hardware and/or software (such as a computer system in which the techniques of the present invention may be practiced as well as implemented as an embodiment).

A machine-readable medium is understood to include any mechanism for storing or transmitting information in a form readable by a machine (e.g., a computer). For example, a machine-readable medium includes read only memory (ROM); random access memory (RAM); magnetic disk storage media; optical storage media; flash memory devices; electrical, optical, acoustical or other form of propagated signals (e.g., carrier waves, infrared signals, digital signals, etc.); etc.

As used in this description, "one embodiment" or "an embodiment" or similar phrases means that the feature(s) being described are included in at least one embodiment of the invention. References to "one embodiment" in this description do not necessarily refer to the same embodiment; however, neither are such embodiments mutually exclusive. Nor does "one embodiment" imply that there is but a single embodiment of the invention. For example, a feature, structure, act, etc. described in "one embodiment" may also be included in other embodiments. Thus, the invention may include a variety of combinations and/or integrations of the embodiments described herein.

Thus a method and apparatus for cross-point detection have been described.

What is claimed is:

1. A method comprising:
establishing a reference voltage;
receiving a differential signal having legs;
comparing each leg of said differential signal to said reference voltage;
noting a time each leg of said differential signal individually crosses said reference voltage denoted as reference crossings;
noting a time said legs of said differential signal cross with respect to each other denoted as differential crossings;
examining timing relationships of said reference crossings and said differential crossings;
identifying characteristics of said differential signal based on said examination;
establishing a time reference and a time hysteresis window around said time reference; and
determining if said differential crossings time is within said time hysteresis window.

2. A method comprising:
establishing a reference voltage;
receiving a differential signal having legs;
comparing each leg of said differential signal to said reference voltage;
noting a time each leg of said differential signal individually crosses said reference voltage denoted as reference crossings;
noting a time said legs of said differential signal cross with respect to each other denoted as differential crossings;
examining timing relationships of said reference crossings and said differential crossings;
identifying characteristics of said differential signal based on said examination;
establishing a voltage hysteresis window around said reference voltage;
establishing a time reference and a time hysteresis window around said time reference;
noting a voltage at said differential crossings;
noting a time at said differential crossings; and
determining if said differential crossings voltage is within said hysteresis window and if said differential crossings time is within said time hysteresis window.

3. A method comprising:
establishing a reference voltage;
receiving a differential signal having legs;
comparing each leg of said differential signal to said reference voltage;
noting a time each leg of said differential signal individually crosses said reference voltage denoted as reference crossings;
noting a time said legs of said differential signal cross with respect to each other denoted as differential crossings;
examining timing relationships of said reference crossings and said differential crossings;
identifying characteristics of said differential signal based on said examination;
noting a voltage at said differential crossings;
generating an average voltage for said voltage at said differential crossings; and
adjusting said reference voltage to said average voltage.

4. The method of claim 3 further comprising communicating said average voltage to a receiving device.

5. The method of claim 3 wherein said generating an average voltage is performed with an integrator.

6. The method of claim 5 wherein said integrator is a charge pump.

* * * * *